United States Patent
Kobayashi et al.

(10) Patent No.: US 8,164,395 B2
(45) Date of Patent: Apr. 24, 2012

(54) SIGNAL MODULATOR

(75) Inventors: Shigeru Kobayashi, Tokyo (JP);
Michiaki Matsuo, San Jose, CA (US);
Junji Sato, Tokyo (JP)

(73) Assignee: Panasonic Corporation, Osaka (JP)

( * ) Notice: Subject to any disclaimer, the term of this patent is extended or adjusted under 35 U.S.C. 154(b) by 47 days.

(21) Appl. No.: 12/810,361

(22) PCT Filed: Dec. 25, 2008

(86) PCT No.: PCT/JP2008/003958
§ 371 (c)(1),
(2), (4) Date: Jun. 24, 2010

(87) PCT Pub. No.: WO2009/084201
PCT Pub. Date: Jul. 9, 2009

(65) Prior Publication Data
US 2010/0271148 A1  Oct. 28, 2010

(30) Foreign Application Priority Data
Dec. 28, 2007 (JP) .................... 2007-340250
Dec. 22, 2008 (JP) .................... 2008-325654

(51) Int. Cl.
*H03K 7/00* (2006.01)
(52) U.S. Cl. .................... 332/107; 332/106
(58) Field of Classification Search ........... 332/106–116
See application file for complete search history.

(56) References Cited

U.S. PATENT DOCUMENTS
2005/0046452 A1 * 3/2005 Briones ............... 327/156
2009/0128247 A1    5/2009 Kobayashi et al.

FOREIGN PATENT DOCUMENTS
| CA | 2 387 399 A1 | 5/2001 |
| JP | 63-246061 A | 10/1988 |
| JP | 2003-513501 A | 4/2003 |
| JP | 2007-89142 A | 4/2007 |

OTHER PUBLICATIONS

Forsythe; "A Coherent, Solid State, 225 GHz Receiver", Microwave Journal, pp. 64-71, Jul. 1982.
International Search Report for PCT/JP2008/003958 dated Mar. 10, 2009.

* cited by examiner

*Primary Examiner* — David Mis
(74) *Attorney, Agent, or Firm* — Pearne & Gordon LLP

(57) ABSTRACT

A signal modulator that can control transmission power if level adjustment of a continuous signal from an oscillator is executed is provided. A pulse generator of one example of a signal modulator includes an oscillator, a control signal generator, a multiplier, a filter, and a control section. The oscillator and the multiplier are active circuits formed of active elements. A continuous signal is output from the oscillator and is input to the multiplier and the multiplier intermittently operates by a control signal output from the control signal generator, whereby a pulse signal is generated and the power level is easily adjusted by a signal from the control section.

8 Claims, 18 Drawing Sheets

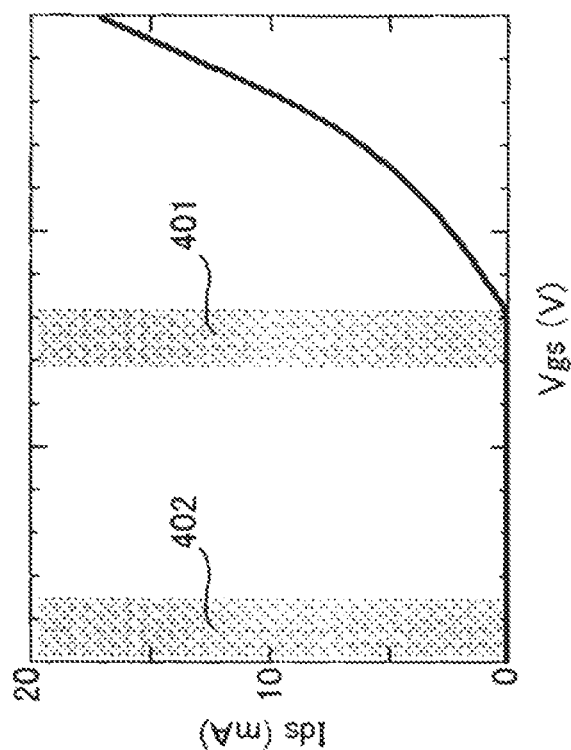
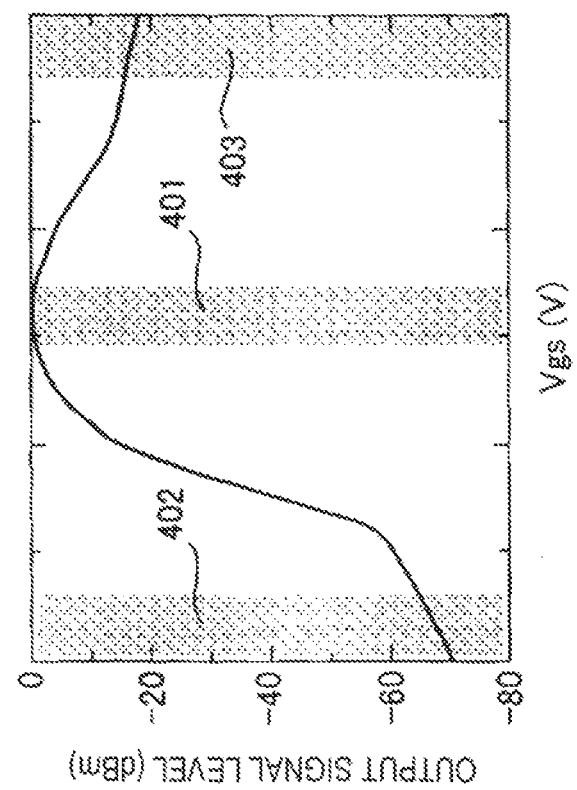
FIG. 4(b)
FIG. 4(a)

US 8,164,395 B2

SIGNAL MODULATOR

TECHNICAL FIELD

This invention relates to a pulse generator and a signal modulator and a transmitter in wireless communications such as a frequency modulation circuit and in particular to a signal modulator and a transmitter having a function of adjusting output power.

BACKGROUND ART

A pulse communication technology exists as one system of communication technology. In the pulse communication technology, system performance depends on how a pulse signal is generated. To make a pulse signal a signal having a component only of any desired frequency band, a method of limiting the frequency band of a pulse signal through a filter and extracting a specific frequency component, a method of intermittently operating an oscillator by a pulse-like control signal, and a method of inputting a pulse-like control signal to a mixer and curtaining a carrier signal, thereby generating a pulse signal exist.

For the pulse generators, required performance includes a short pulse property and a high on/off ratio. The short pulse property contributes to communication speed improvement in communications using a pulse signal. The high on/off ratio contributes to communication quality improvement in communications using a pulse signal.

FIG. 12 shows the block configuration of a related art concerning a short pulse generator using a mixer. FIG. 13 is a timing chart of signal waveforms in FIG. 12. The related art will be discussed below with FIGS. 12 and 13.

A signal 1301 output from an oscillator 1201 is input to a mixer 1203. On the other hand, a control signal 1302 output from a control signal generator 1202 is also input to the mixer. The signal 1301 is curtained by the control signal 1302 and is output from the mixer 1203 as a pulse signal 1303. The circuit configuration is very simple and does not involve a circuit delay element and is excellent in the viewpoint of the short pulse property. However, the signal from the oscillator 1201 leaks when it is off and thus there is a problem in that the on/off ratio is low (refer to Non-patent Document 1).

On the other hand, a circuit for realizing a high on/off ratio by intermittently operating an oscillator as shown in FIG. 14 is proposed. FIG. 15 is a timing chart of signal waveforms in FIG. 14. The related art will be discussed below with FIGS. 14 and 15:

An oscillator 1401 is intermittently operated by a pulse-like control signal 1501 output from a control signal generator 1202 and generates a pulse signal 1502 corresponding to an on interval at which the voltage level is high. At an off interval, the oscillator 1401 does not operate and thus a signal does not leak and a high on/off ratio can be realized. However, the transient characteristic of the pulse signal 1501 is degraded because of operation delay at the operation start time of the oscillator and it is difficult to ensure a good short pulse property (refer to Patent Document 1).

In the related arts shown above, the circuit configuration satisfying demands for the short pulse property and the high on/off ratio at the same time is not provided. In the related art using the mixer (FIG. 12, FIG. 13), it is difficult to realize a high on/off ratio. In the related art using the intermittent oscillator (Non-patent Document 1), it is difficult to ensure a good short pulse property. As a method of solving the two problems, an intermittent multiplication technique of generating a pulse signal by intermittently operating a multiplier exists.

In the intermittent multiplication technique, the multiplier is directly controlled by a control signal and is intermittently operated, whereby high on/off ratio is realized. A pulse generator using the intermittent multiplication technique includes an oscillator, an intermittent multiplier and a filter. A continuous signal generated by the oscillator is input to the intermittent multiplier. the continuous signal and a pulse like control signal having an on interval at which the voltage level is high and an off interval at which the voltage level is low are input to the intermittent multiplier. The intermittent multiplier intermittently operates by a control signal. The circuit operates at the on interval, whereby a harmonic is generated and the circuit does not operate at the off interval, whereby harmonic generation is suppressed. The continuous signal leaking at the off interval is removed through the filter provided at the later stage of the intermittent multiplier and a pulse signal is obtained as an output signal. Accordingly, compatibility between the short pulse property and the high on/off ratio is made possible. Thus, in the intermittent multiplication technique, the oscillator is provided with the oscillation function and the intermittent multiplier is provided with the modulation function and the multiplication function, whereby pulse communications can be realized according to the simple configuration.

On the other hand, as another system of communication technology, frequency modulation communication technology exists. In the pulse communications, data is superposed on amplitude change; while, in frequency modulation communications, a data signal is superposed on frequency change for communications. Usually, to realize frequency modulation communications, a circuit for performing quadrature modulation is formed, but there is a disadvantage in that the circuit configuration is complicated. As a technique for compensating for the disadvantage, VCO (Voltage Controlled Oscillator) modulation technique exists. FIG. 16 shows the circuit configuration to perform VCO modulation and FIG. 17 shows signal waveforms in VCO modulation. A control signal 1702 output from a control signal generator 1602 is input to a control signal terminal (hereinafter, Vt terminal) of a VCO 1601 and oscillation frequency is changed by the control signal 1702, whereby frequency modulation is performed. The frequency of the frequency-modulated signal 1701 is multiplied in a multiplier 1603 at the later stage and an output signal 1703 is output from an output terminal 1604. Thus, in the VCO modulation technique, the VCO is provided with the oscillation function and the modulation function and the multiplier is provided with the multiplication function, whereby frequency modulation communications can be realized according to the simple configuration.

Non-patent Document 1: R. F. Forsythe, "A coherent solid sate, 225 GHz receiver," Microwave journal, pp. 64-71 1982
Patent Document 1: JP-A-2003-513501

DISCLOSURE OF THE INVENTION

Problems to be Solved by the Invention

In the pulse generator using the intermittent multiplication technique shown above, compatibility between the short pulse property and the high on/off ratio can be provided. In the frequency modulation circuit using the VCO modulation technique shown above, the frequency modulation circuit can be formed according to the simple configuration. When a communication apparatus is provided with the pulse generator using the intermittent multiplier and the VCO modulation circuit, a control function of transmission power needs to be provided as with a conventional circuit to keep transmission power in an output terminal of a transmission apparatus constant and to control transmission power according to the communication distance. In pulse communications, in the conventional pulse generator using the mixer, the level of the continuous signal from the oscillator is adjusted, whereby transmission power can be easily controlled. In frequency modulation communications, in the conventional quadrature modulation configuration, the level of the continuous signal from the oscillator is adjusted, whereby transmission power can be easily controlled. In the related arts, the mixer provided at the later stage of the oscillator includes the modulation function and the mixer performs linear operation.

However, in the pulse generator using the intermittent multiplier, if the level of the continuous signal from the oscillator is adjusted, the conversion gain characteristic of the intermittent multiplier changes in accordance with the level and thus linear control of transmission power cannot be performed. Likewise, in the VCO modulation circuit, if the bias voltage condition is changed to adjust the level of the continuous signal from the oscillator, the Vt value to oscillate in any desired frequency area changes and thus simplistic transmission power control cannot be performed.

In view of the circumstances described above, it is an object of the invention to provide a signal modulator that can control transmission power if level adjustment of a continuous signal from an oscillator is executed.

Means for Solving the Problems

To accomplish the object, a signal modulator of the invention is a signal modulator for generating a pulse signal based on a continuous signal output from an oscillator. The signal modulator includes a control signal generator that outputs a first control signal containing an on interval and an off interval different in voltage value from the on interval in a time axis; an intermittent multiplier that receives inputs of the first control signal and the continuous signal and multiplies the continuous signal corresponding to the on interval of the first control signal to output the pulse signal; and a control section that detects a level of the pulse signal to generate a second control signal for controlling a level of the continuous signal output from the oscillator and a third control signal for controlling a conversion gain of the intermittent multiplier, wherein the conversion gain of the intermittent multiplier at the on interval of the first control signal is higher than the conversion gain of the intermittent multiplier at the off interval of the first control signal.

According to the configuration, if level adjustment of the continuous signal from the oscillator is executed, a good pulse can be generated and transmission power can be controlled. Specifically, level adjustment of the control signal for controlling the intermittent multiplier is executed conforming to level adjustment of the continuous signal from the oscillator or the bias point of the intermittent multiplier is adjusted, whereby transmission power level adjustment can also be easily executed in a short pulse generator using the intermittent multiplier. Thus, the short pulse generator providing compatibility between a high on/off ratio and the short pulse property can be configured and control of output power can be facilitated.

In the signal modulator of the invention, the intermittent multiplier has an active element and a control signal input end connected to a control terminal of the active element, the control signal input end to which the first control signal is input, and a cutoff frequency of impedance obtained by measuring the active element side from the control signal input end is equal to or greater than the reciprocal of a time width of the on interval of the first control signal.

According to the configuration, the dull waveform of the output signal waveform can be suppressed.

The signal modulator of the invention includes a branch circuit that branches an output signal of the intermittent multiplier to radiate one output signal to space and to output the other output signal to the control section.

According to the configuration, a pulse signal generated in the signal modulator can be output to a different circuit.

The signal modulator of the invention includes a switch that branches an output signal of the intermittent multiplier to radiate one output signal to space and to output the other output signal to the control section.

According to the configuration, the signal modulator can be applied to a transmitter-receiver.

The signal modulator of the invention includes a filter that allows a frequency band component of the output signal of the intermittent multiplier to pass through and suppresses other frequency band components of the output signal of the intermittent multiplier.

According to the configuration, the spurious component of any other frequency band than the desired frequency can be suppressed.

In the signal modulator of the invention, an amplitude of the first control signal output from the control signal generator is greater than an amplitude of the continuous signal measured in a control terminal of the active element at the off interval of the first control signal.

According to the configuration, a very high on/off ratio can be ensured.

The signal modulator of the invention includes an amplification section that amplifies the first control signal and is provided between the control signal input end and a control terminal of an active element, and the first control signal, amplified by the amplification section and having an amplitude being larger than an amplitude of the continuous signal, is input to the active element at the off interval of the first control signal.

According to the configuration, a very high on/off ratio can also be ensured by the control signal at a low voltage level.

A signal modulator of the invention includes a control signal generator that generates a first control signal containing an on interval and an off interval different in voltage value from the on interval in a time axis; a voltage controlled oscillator that outputs a modulation signal subjected to a frequency modulation based on the first control signal; and a control section that detects a level of the modulation signal to generate a second control signal for controlling a level of the modulation signal output from the voltage controlled oscillator and a third control signal for controlling a voltage level of a voltage control terminal of the voltage controlled oscillator.

According to the configuration, if level adjustment of a continuous signal modulated by voltage control of the oscillator (voltage controlled oscillator) is executed, transmission power can be controlled.

Advantages of the Invention

According to the invention, if level adjustment of a continuous signal from the oscillator is executed, transmission power can be controlled.

For example, the circuit is a pulse generator for generating a pulse signal based on a continuous signal output from an oscillator and includes a control signal generator that outputs a first control signal containing an on interval and an off interval different in voltage value from the on interval in a time axis; an intermittent multiplier that receives inputs of the first control signal and the continuous signal and multiplies the continuous signal corresponding to the on interval of the first control signal to output the pulse signal; and a control section that detects a level of the pulse signal to generate a second control signal for controlling a level of the continuous signal output from the oscillator and a third control signal for controlling a conversion gain of the intermittent multiplier, wherein the conversion gain of the intermittent multiplier at the on interval of the first control signal is higher than the conversion gain of the intermittent multiplier at the off interval of the first control signal, so that a short pulse generator that can generate a pulse signal at a high on/off ratio and can easily adjust output power can be realized.

For example, the circuit includes a control signal generator that generates a first control signal containing an on interval and an off interval different in voltage value from the on interval in a time axis; a voltage controlled oscillator that outputs a modulation signal subjected to a frequency modulation based on the first control signal; and a control section that detects a level of the modulation signal to generate a second control signal for controlling a level of the modulation signal output from the voltage controlled oscillator and a third control signal for controlling a voltage level of a voltage control terminal of the voltage controlled oscillator, so that the bias voltage applied to the voltage control terminal of the voltage controlled oscillator is controlled, whereby a frequency modulation circuit including the power control function can be easily realized.

BRIEF DESCRIPTION OF THE DRAWINGS

FIG. 4 is a drawing to show the feature of the relationship between control signal voltage value and output signal level in the first embodiment of the invention.

DESCRIPTION OF REFERENCE NUMERALS

Figure 1:
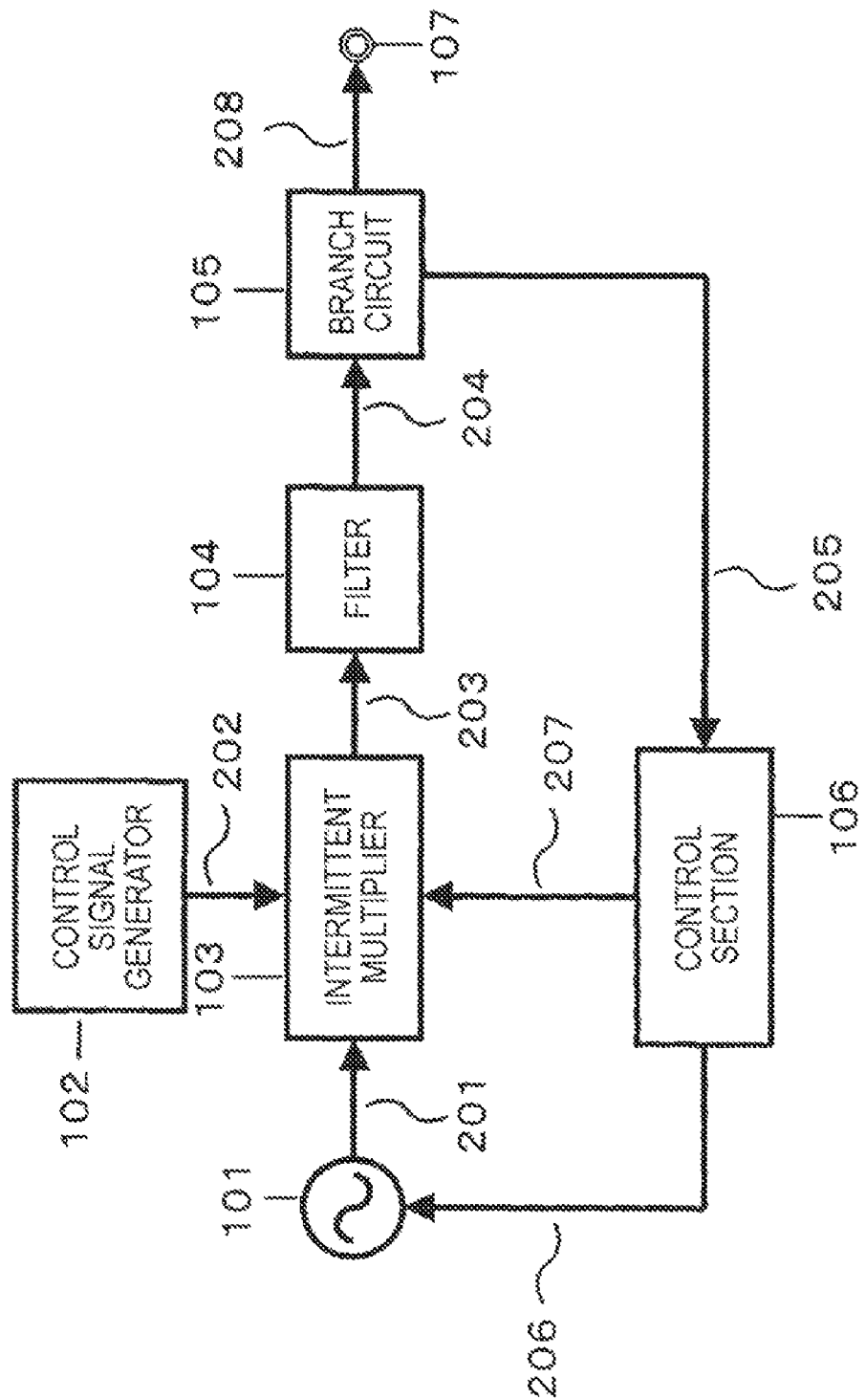
FIG. 1 is a drawing to show the circuit configuration of a communication apparatus in a first embodiment of the invention.

101 Oscillator
102 Control signal generator
103 Intermittent multiplier
104 Filter
105 Branch circuit
106 Control section
107 Output terminal
201-208 Signal
301 Active element
302 Matching circuit
303 Matching circuit
304 Coupler
305 Coupler
306 Filter
307 DC feed device
308 Power supply
309 Bypass capacitor
310 Control signal input end
312 Amplification section
401-403 Control area
501-503 Characteristic curve
601, 602 Power value
603, 604 Characteristic curve
701 Current source
702 Resistor
703 Power supply
801 Filter
802 DC feed device
803 Power supply
901 Current source
1001 Switch
1002 Detector
1003 Control section
1101 Mixer
1102 Control section
1103 Multiplier
1201 Oscillator
1202 Control signal generator
1203 Mixer
1204 Output terminal
1301-1303 Signal
1401 Oscillator
1501, 1502 Signal
1601 VCO 1602 Control signal generator
1603 Multiplier
1604 Output terminal
1701-1703 Signal
1801 VCO
1802 Control signal generator
1803 Multiplier
1804 Branch circuit
1805 Output terminal
1806 Control section
1807 Vt terminal of VCO
1808 Different terminal of VCO
1901-1907 Signal

BEST MODE FOR CARRYING OUT THE INVENTION

Embodiments of the invention will be discussed with reference to the accompanying drawings.

(First Embodiment)

FIG. 1 is a block diagram of a communication apparatus in a first embodiment of the invention. A transmitter shown in FIG. 1 includes an oscillator 101, a control signal generator 102, an intermittent multiplier 103, a filter 104, and a branch circuit 105, a control section 106, and an output terminal 107. The oscillator 101 and the intermittent multiplier 103 are active circuits formed of active elements.

Hereinafter, the active element will be discussed as FET (field effect transistor). The multiplication number of the intermittent multiplier is n (n: A positive integer). In the description to follow, desired frequency of an output signal of the oscillator is f0, and the intermittent multiplier is a 2 multiplier (double). The signal waveform of a control signal output from the control signal generator 102 is arbitrary, but hereinafter will be discussed as a pulse waveform.

A continuous signal is output from the oscillator 101 and is input to the intermittent multiplier 103. The intermittent multiplier 103 is intermittently operated by a control signal output from the control signal generator 102, whereby a pulse signal is generated. A spurious component output from the intermittent multiplier 103 is removed through the filter 104. The pulse signal whose spurious component is removed through the filer is input to the branch circuit 105, and one is sent to the output terminal 107 and is output as a transmission signal. The other is input to the control section 106 and the level of received signal is detected. A control signal input to the oscillator 101 and a control signal input to the intermittent multiplier 103 are generated based on the value detected in the control section 106. The control signal input to the oscillator 101 controls the output level of the oscillator. The control signal input to the intermittent multiplier 103 controls conversion gain of the intermittent multiplier 103. The control signals control the output level of a pulse signal output from the output terminal 107. As the operation described above is performed, a pulse generator that can generate a pulse signal at a high on/off ratio (amplitude ratio at the on time and at the off time) and can adjust (control) power level is configured. The pulse generator is an example of a signal modulator for performing signal modulation.

Figure 2:
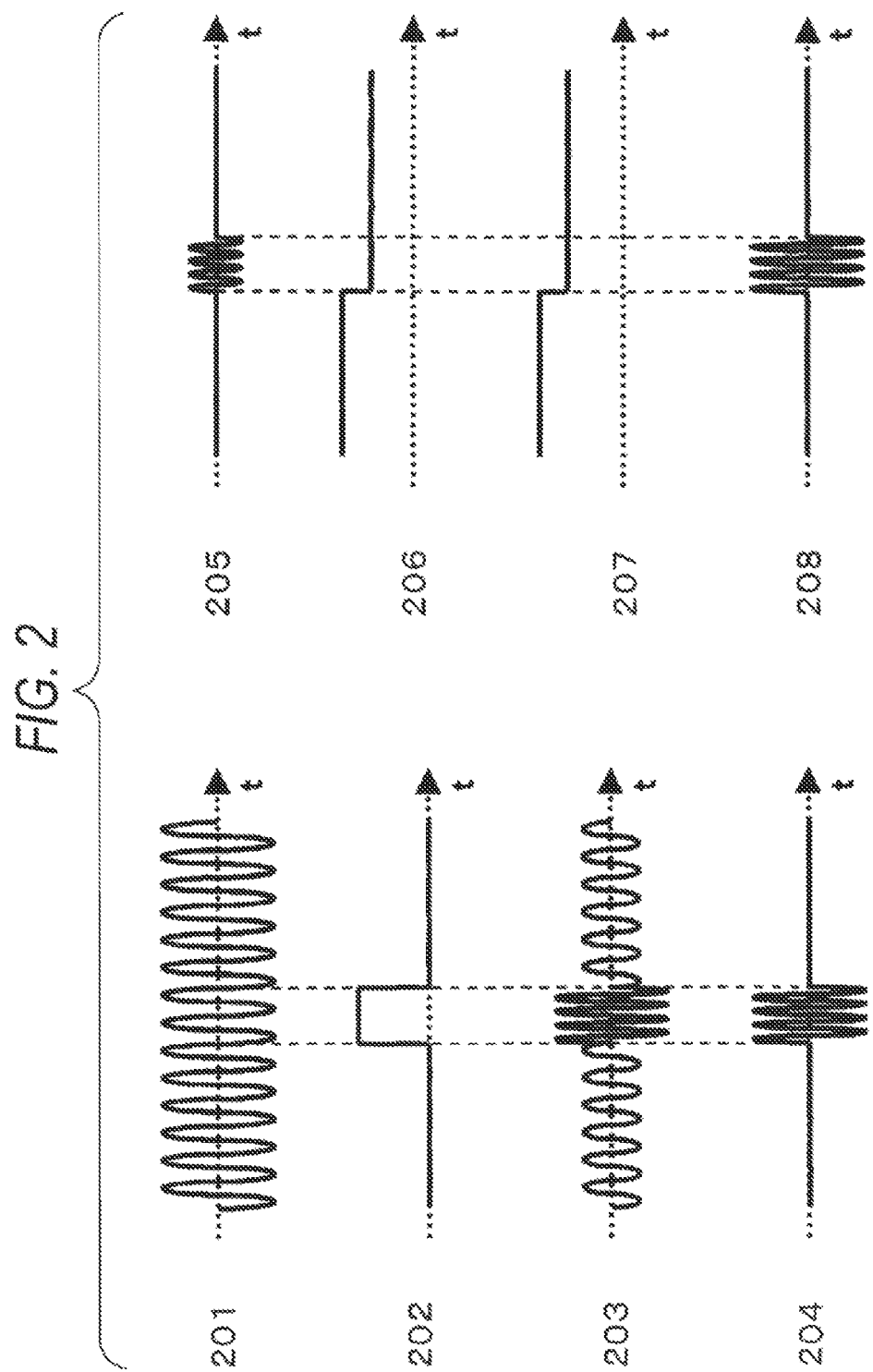
FIG. 2 is a drawing to show the features of signal waveforms in the first embodiment of the invention.

FIG. 2 is a timing chart of the signals and the control signals in the block diagram of FIG. 1. The vertical axis is the voltage and the horizontal axis is the time. The pulse generator that can generate a pulse signal at a high on/off ratio and can adjust the power level in the embodiment will be discussed with FIGS. 1 and 2.

A signal 201 is generated in the oscillator 101 and is sent to the intermittent multiplier 103. The circuit configuration of the oscillator 101 is a known art and therefore will not be discussed.

A control signal 202 output from the control signal generator 102 is input to the intermittent multiplier 103 and the operation point of the FET of the component of the intermittent multiplier 103 is controlled according to the voltage value of the control signal 202.

The operation point of the FET is controlled, whereby the conversion gain can be made high at the interval at which the voltage value of the control signal 202 is high (hereinafter, on interval) and the conversion gain can be made low at the interval at which the voltage value is low (hereinafter, off interval).

Thus, the main component at the off interval in a signal 203 becomes a signal of frequency f0/2 of a half a carrier frequency f0, the component of the frequency f0 output from the intermittent multiplier 103 differs largely in the amplitude value between the on interval and the off interval, and the difference becomes the on/off ratio (units: dB). It is desirable that the voltage values at the on interval and the off interval of the control signal 202 should be set so that the conversion gain becomes the maximum at the on interval.

To configure the pulse generator that can generate a pulse signal at a high on/off ratio and can adjust the power level, the operation of the intermittent multiplier 103 becomes important. The operation of the intermittent multiplier 103 will be discussed as follows.

Figure 3:
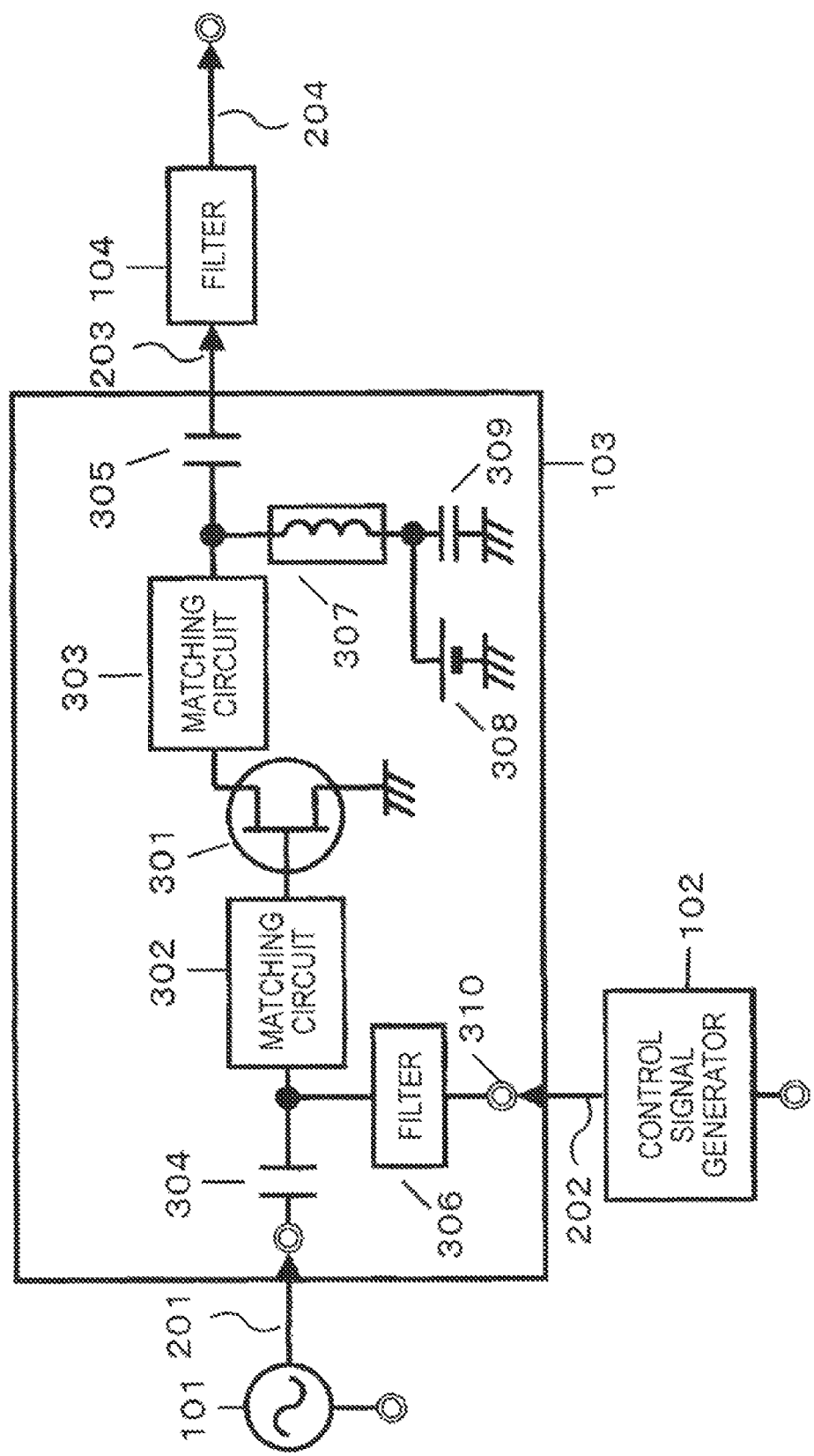
FIG. 3 is a drawing to show one example of the circuit configuration of an intermittent multiplier in the first embodiment of the invention.

FIG. 3 shows one example of the intermittent multiplier 103. The intermittent multiplier 103 shown in FIG. 3 includes an active element 301, a matching circuit 302, a matching circuit 303, a coupler 304, a coupler 305, a filter 306, a DC feed device 307, a power supply 308, a bypass capacitor 309, and a control signal input end 310.

As a control method of the operation point, a gate-source voltage (Vgs) is directly controlled by the control signal 202. The continuous signal 201 output from the oscillator 101 is input from the gate terminal side of the active element 301. The coupler 304 and the coupler 305 are provided for cutting DC and are implemented as a capacitor element and a parallel coupling line.

A high frequency signal passing through the coupler 304 is the continuous signal 201 output from the oscillator 101; if phase noise is not considered, the spectrum waveform does not have spread and thus a wide band is not required for the passage band of the coupler 304.

On the other hand, a high frequency signal passing through the coupler 305 is a burst-like pulse signal. Since the spectrum waveform of the pulse signal has a wide band, a wide band is required for the passage band of the coupler 305 and it is desirable that the band should be twice or more the reciprocal of the pulse width of the pulse signal. The matching circuit 302 is an input side matching circuit and the matching circuit 303 is an output side matching circuit. The design of the matching circuit is a known art and therefore will not be discussed. The matching circuit 302 is designed so that impedance is matched at the on interval, and a reflection coefficient is set so that reflection does not occur. The matching circuit 302 is designed so that the impedance becomes unmatched at the off interval.

The filter 306 is a filter which becomes open at frequency f0/2 or is in the proximity thereof on a Smith chart when the impedance of the filter 306 side is observed from the transmission line connecting the matching circuit 302 and the coupler 304. In a distribution constant line, it is made up of electrical length λg/4 open stub and electrical length λg/4 line at the frequency f0/2. In a lumped-parameter element, it is made up of a capacitative element and a dielectric element.

When the filter 306 side (namely, the active element 301 side) is observed from the control signal input end 310, the frequency characteristic of input impedance becomes LPF (low-pass filter) in a low frequency band from DC because of the effect of the frequency characteristic of the filter 306. It is desirable that the cutoff frequency of the LPF at the time should be the reciprocal or more of the pulse width of the control signal 202.

When the cutoff frequency is lower than the reciprocal of the pulse width of the control signal 202, the waveform of the control signal becomes dull and thus the high speed property of Vgs control is impaired. Accordingly, the rising and falling waveforms of the output signal 204 do not become steep. The rising and falling waveforms of the output signal 204 do not become steep and thus the pulse width becomes narrow and the spectrum waveform spreads. Accordingly, for example, a spurious component can occur for the frequency band outside the assigned channel band in communications.

If the total of the rising time and the falling time becomes equal to or more than the pulse width because the waveform is dull, the amplitude value of the output signal 204 lowers and SN degradation occurs. The cutoff frequency can be set according to the line length, the line width, and stub in the circuit design.

It is desirable that the filter 306 should be open at frequency f0 or be in the proximity thereof on a Smith chart when the impedance of the filter 306 side is observed from the transmission line connecting the matching circuit 302 and the coupler 304. Accordingly, rounding of the signal of the frequency f0 existing in the circuit to the power supply side can be prevented, contributing to stabilization of the circuit.

When the impedance of the DC feed device 307 side is observed from the transmission line connecting the matching circuit 303 and the coupler 305, the DC feed device 307 is open at least frequency f0 and frequency f0/2 and ideally allows only a DC component to pass through.

For example, in a distribution constant line, it is made up of electrical length λg/4 open stub and electrical length λg/4 line. In a lumped-parameter element, it is made up of a capacitative element and a dielectric element. The bypass capacitor 309 is installed on the power supply 308 side for preventing parasitic oscillation.

On the other hand, a bypass capacitor is not provided at the control signal input end 310. If a bypass capacitor is provided at the control signal input end 310, a resistance component and a capacitance component existing in the line and the circuit are combined, the time constant becomes large, and the waveform of the control signal 202 becomes dull. As the waveform becomes dull, the rising and the falling of the output waveform 204 do not become steep as described above.

FIG. 4(a) is a drawing to show the characteristic curve of level of frequency f0 component at output signal level and Vgs in the circuit configuration in FIG. 3. The characteristic curve is normalized at the maximum value of the output signal level. The drain-source voltage (hereinafter, Vds) at the time is Vds1.

In FIG. 4(a), the output signal level difference between an area 401 and an area 402 is about 70 dB, it is desirable that the voltage value of the control signal 202 at the on interval should be Vgs in the area 401 and that the voltage value of the control signal 202 at the off interval should be Vgs in the area 402, and a pulse signal at the on/off ratio 70 dB of output signal can be generated. The horizontal axis of FIG. 4(a) is 0.1 V/div and voltage value setting at the on interval and the off interval of the control signal 202 is realistic.

FIG. 4(b) is a drawing to show the relationship between Vgs and Id. Area 401 and area 402 in FIG. 4(b) are made to correspond to those in FIG. 4 (b). Thus, Vgs in the area 401, namely, Vgs at which the conversion gain becomes the maximum is a pinch off voltage or a voltage value in the proximity thereof and drain current (Id) flowing through the circuit becomes a very small value. Since the voltage value of the control signal 202 at the off interval is Vgs in the area 402, no current flows at the off interval. Thus, the circuit operates with low power consumption and further, parasitic oscillation of the circuit is also hard to occur.

At this time, setting is made so that the amplitude (voltage value) at the on interval of the control signal 202 becomes larger than the amplitude (voltage value) of continuous signal observed at the gate end at the off interval. The amplitude at the off interval is the potential difference between the potential at the on interval of the control signal 202 and the potential at the off interval. If the amplitude of the continuous signal at the off interval is larger than the amplitude at the on interval of the control signal 202, the peak value of the amplitude of the continuous signal at the off interval becomes higher than the potential at the on interval of the control signal 202. Since the potential at the on interval of the control signal 202 is set at the pinch off voltage, the peak value of the amplitude of the continuous signal at the off interval becomes equal to or more than the pinch off voltage. When the amplitude of the continuous signal becomes equal to or more than the pinch off voltage, a harmonic occurs and thus to prevent a harmonic from occurring at the off interval, setting needs to be made so that the amplitude of the continuous signal at the off interval is made smaller than the amplitude at the on interval of the control signal 202.

Figure 20:
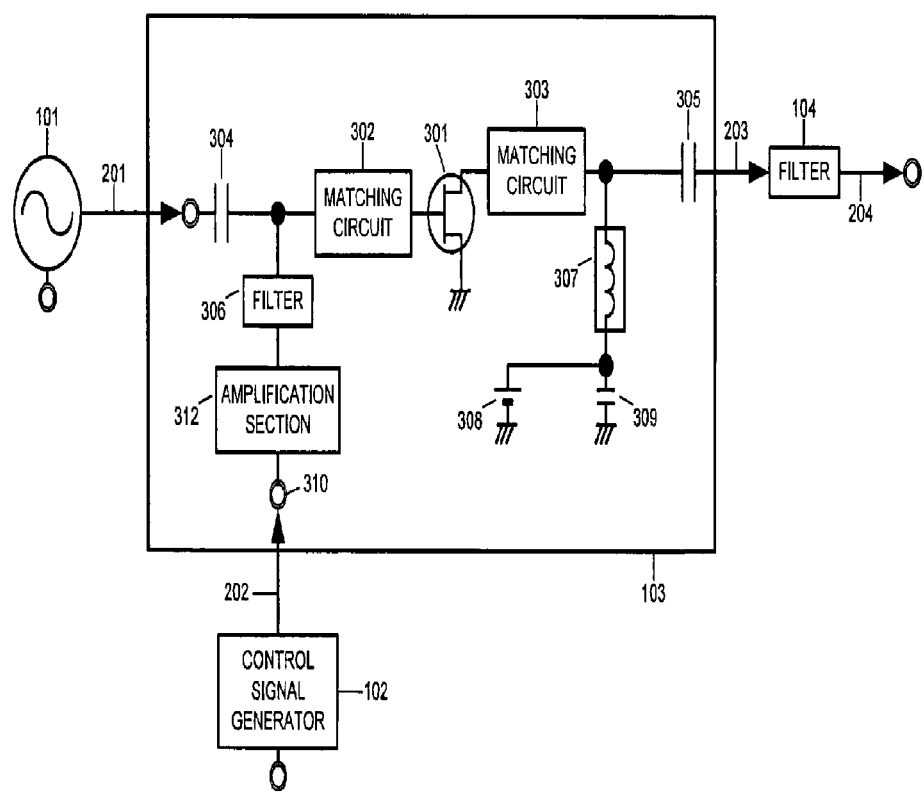
FIG. 20 is a drawing to show one example of the circuit configuration of an intermittent multiplier in the first embodiment of the invention.

If an amplification section for amplifying the voltage value of the control signal 202 is inserted between the control signal input end 310 and the gate end of the active element 301 (see amplification section 312 shown in FIG. 20), setting may be made so that the amplified voltage value of the control signal 202 becomes larger than the amplitude (voltage value) of the continuous signal observed at the gate end of the active element 301, and the voltage value of the control signal 202 need not necessarily be larger than the amplitude (voltage value) of the continuous signal observed at the gate end of the active element 301. In so doing, power consumption of a base band circuit for generating the control signal 202 can be decreased.

By the way, the voltage value of the control signal 202 at the off interval can also be an area 403, but it is obvious that it is difficult to ensure a high on/off ratio and further Id is large and thus power consumption becomes high and parasitic oscillation of the circuit also easily occurs.

In the rising part of intermittent operation, a current also flows at the off interval and thus terminal-to-terminal capacitance of FET and stray capacitance existing in the circuit can be previously charged, leading to the high speed property of the intermittent operation; however, it is desirable that the voltage value of the control signal 202 at the off interval should be set in the area 402 from the viewpoints of a high on/off ratio, lower power consumption operation, and circuit stability.

Figure 5:
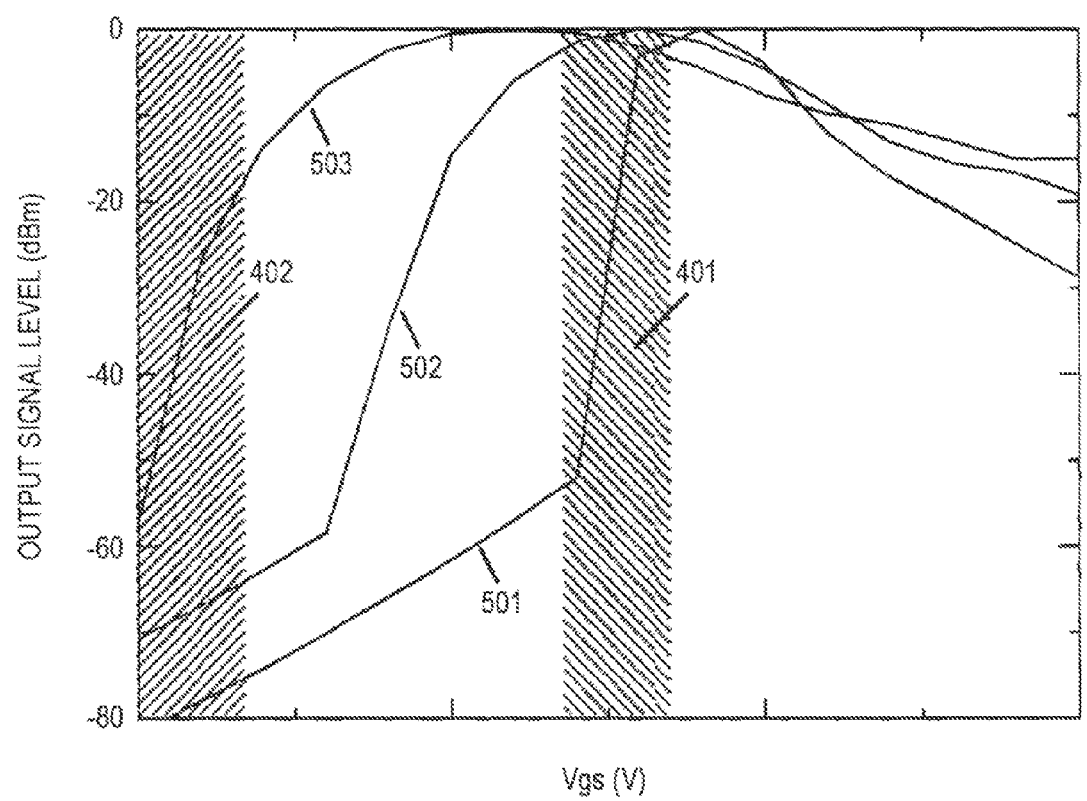
FIG. 5 is a drawing to show the feature of the relationship between control signal voltage value and output signal level in the first embodiment of the invention.

FIG. 5 is a drawing to show the characteristic curve of level of frequency f0 component at output signal level and Vgs in the circuit configuration in FIG. 3 by comparing for each input signal level. The vertical axis of each characteristic curve is normalized at the maximum value for each output signal level. The input signal level increases in the order of characteristic curves 501, 502, and 503.

From FIG. 5, if the voltage value of the control signal 202 at the on interval is Vgs in the area 401 and the voltage value of the control signal 202 at the off interval is Vgs in the area 402, for the larger input signal level, change start of the output signal level is early for change of Vgs.

In other words, for the larger input signal level, the rising and the falling of the output signal 204 are early for change of the voltage value (Vgs) of the control signal 202 and it is desirable that the input signal level should be large from the viewpoint of the high speed property of the intermittent operation. However, if the input signal level is small, the on/off ratio is high and the input signal level to the intermittent multiplier 103 needs to be designed conforming to the system specification. Thus, the high speed property of the intermittent operation and the on/off ratio depend on the input signal level to the intermittent multiplier 103, namely, the signal level of the signal 201 from the oscillator 101.

Figure 6:
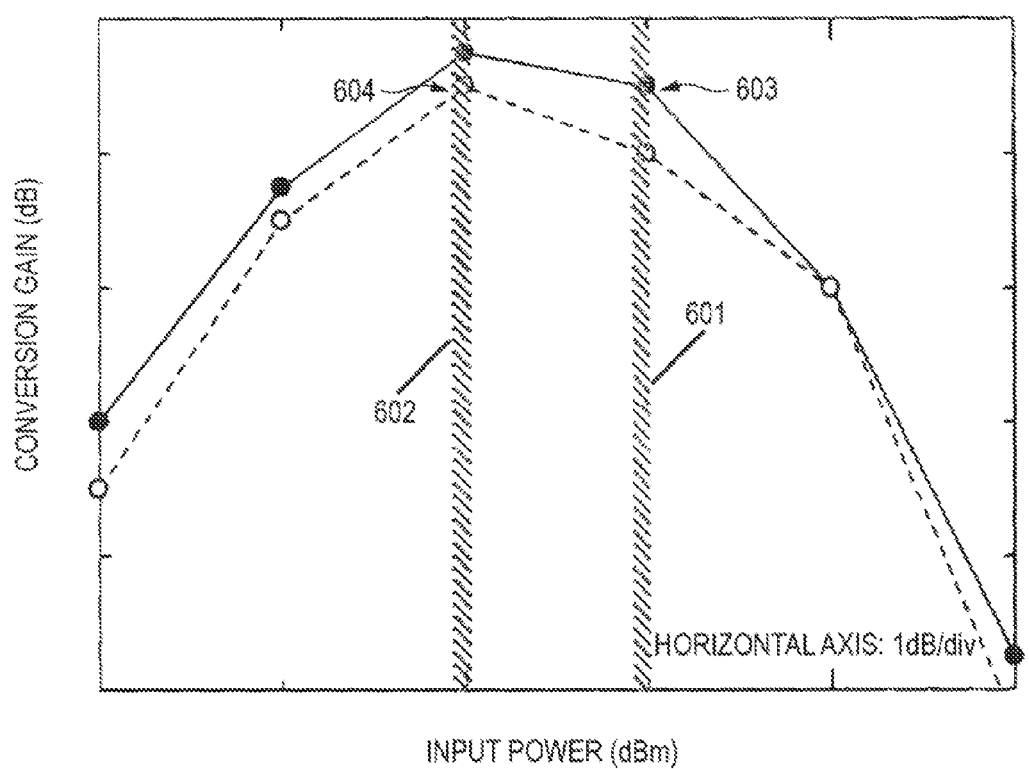
FIG. 6 is a drawing to show the feature of the relationship between input power level and conversion gain in the first embodiment of the invention.

FIG. 6 is a drawing to show the characteristic of conversion gain relative to the power level of the signal 201 in the circuit configuration in FIG. 3 by changing Vd. The characteristic curve indicated by the solid line and the characteristic curve indicated by the dashed line differ in the value of Vd. From FIG. 6, the power amount of the continuous signal is changed, whereby the conversion gain changes. For example, in the Vd characteristic indicated by the solid line in FIG. 6, conversion gain when power 602 1 dB lower than power 601 is input to the intermittent multiplier is not the same value as conversion gain when power 601 is input to the intermittent multiplier. Thus, the difference between the output level when power 601 is input to the intermittent multiplier and the output level when power 602 is input to the intermittent multiplier becomes 1 dB or less and if the input power is 1 dB controlled, it is difficult to control output power 1 dB.

If Vd is controlled while the input power level is decreased, the conversion gain can be kept constant while the input power level is lowered and the decrease in the input power level and decrease in the output power level match. For example, the case where the power 601 is input with Vd set to the solid line characteristic is considered. To lower the output power 1 dB, the input power may be controlled from the power 601 to the power 602 and Vd may be set to the dashed line characteristic, because the conversion gains at a point 603 in the solid line characteristic of Vd and a point 604 in the dashed line characteristic are the same values.

As shown above, the conversion gain of the intermittent multiplier 103 at the on interval of the control signal and the conversion gain at the off interval are changed and the frequencies of the main component at the on interval and the off interval are changed, whereby the intermittent multiplier for generating a pulse signal at a high on/off ratio can be realized in low power consumption operation. The intermittent multiplier is a circuit having the characteristics described in FIGS. 4 to 6. The intermittent multiplier has been described in detail. A pulse generator that can generate a pulse signal at a high on/off ratio and can adjust the power level will be discussed below with FIGS. 1 and 2:

The signal 203 output from the intermittent multiplier 103 is input to the filter 104. The filter 104 is a spurious suppression filter for allowing a signal in the frequency f0 band to pass through and suppressing other frequency band components; for example, it is a BPF (band-pass filter) or a BEF (band elimination filter) and can also be formed in a lumped constant or a distribution constant.

It is desirable that a band twice or more the reciprocal of the time width of the on interval of the signal 203 should be ensured as the band of the filter 104 to prevent the waveform from becoming dull when the signal 204 is output from the filter 104.

The signal 203 passes through the filter 104, whereby the signal in the frequency f0 band passes through and the signal in the frequency f0/2 band is suppressed and thus the pulse signal 204 at a high on/off ratio having the frequency component in the frequency f0 band is output from the branch circuit 105.

The pulse signal 204 is input to the branch circuit 105 and is branched to a signal 205 and a signal 208. The signal 205 is provided for adjusting the power level and thus has a small power level as compared with the signal 208 of an output signal of a transmitter. The branch circuit is a known art and therefore will not be discussed in detail. The signal 208 output from the branch circuit 105 is output to an output terminal 107. On the other hand, the signal 205 is input to the control section 106 and the level of the signal 205 is detected. The control section 106 detects the power value of the signal in the frequency f0 band and is not involved in the power value of the signal in any other band.

The control section 106 makes a comparison between the detection value and a desired value. The desired value is calculated from any desired output level in the output terminal 107 and the distribution ratio in the branch circuit 105. For example, if the desired output level is P1 and the distribution ratio is 9:1, the desired value in the control section 106 becomes P1/10. The control section 106 generates a signal 206 for controlling the operation of the oscillator 101 and a signal 207 for controlling the operation of the intermittent multiplier. If a difference exists between the detection value and the desired value in the control section 106, the operation of the oscillator 101 and the intermittent multiplier 103 is controlled by the control signal 206 and the control signal 207. Thus, level adjustment of the signal 201 from the oscillator 101 and adjustment of the conversion gain in the intermittent multiplier 103 are performed.

Specifically, the control signal 206 controls the oscillator 101, thereby controlling the signal level of the signal 201. The part of the oscillator 101 controlled by the control signal 206 is bias of FET of the component and is, for example, a drain voltage and a gate voltage. A switch may be provided at the later stage of the oscillator 101 and may be switched for adjusting the signal level of the signal 201. These techniques are known arts and therefore will not be discussed.

The control signal 207 controls the intermittent multiplier 103, thereby controlling the conversion gain of the intermittent multiplier 103. The part of the intermittent multiplier controlled by the control signal 207 is bias of FET of the component and is, for example, a drain voltage and a gate voltage.

For example, the case where the control section 106 determines that the power level in the output terminal 107 is smaller 1 dB than the desired value is considered. In this case, the control signal 206 controls so as to decrease 1 dB the power level of the signal 201 output from the oscillator 101; when the power level of the signal 201 changes, the conversion gain of the intermittent multiplier 103 changes as described in FIG. 6. Thus, if the power level of the signal 201 is decreased 1 dB, the output power level does not necessarily decrease 1 dB.

Then, the control signal 207 controls the intermittent multiplier 103, thereby controlling the conversion gain. For example, if the value of Vd of the component of the intermittent multiplier 103 is controlled, the conversion gain changes. As shown in FIG. 6, if control is performed so that the conversion gain of the intermittent multiplier 103 does not change from the conversion gain before the power level is decreased 1 dB, the output power level can be decreased by the decrease in the input power level and the transmission power level can be easily controlled.

As shown above, the conversion gains of the intermittent multiplier 103 at the on interval of the control signal and the conversion gain at the off interval are changed and the frequencies of the main component at the on interval and the off interval are changed, whereby the intermittent multiplier for generating a pulse signal at a high on/off ratio can be configured. The pulse generator, that generates a pulse signal at a high on/off ratio and can adjust the power level, can be configured by using the intermittent multiplier, the control signal generator for generating a signal for controlling the conversion gain of the intermittent multiplier, and the control section 106.

For example, if a difference exists between the detection value in the control section 106 at the on interval and the desired value to be generated as a pulse signal, the following processing is performed so that the detection value is brought close to the desired value: First, the control signal 206 is used to adjust the signal power level of the signal 201 output from the oscillator 101. Further, the control signal 207 is used to adjust the intermittent multiplier 103, whereby the conversion gain of the intermittent multiplier 103 can be kept constant. Thus, it is made possible to generate desired pulse signal more reliably.

Here, the method of controlling Vgs directly by the control signal 202 is described as the control method of the intermittent multiplier 103. However, a method of controlling a current by a control signal and controlling the voltage value applied to a resistor as the current flows may be adopted.

Figure 7:
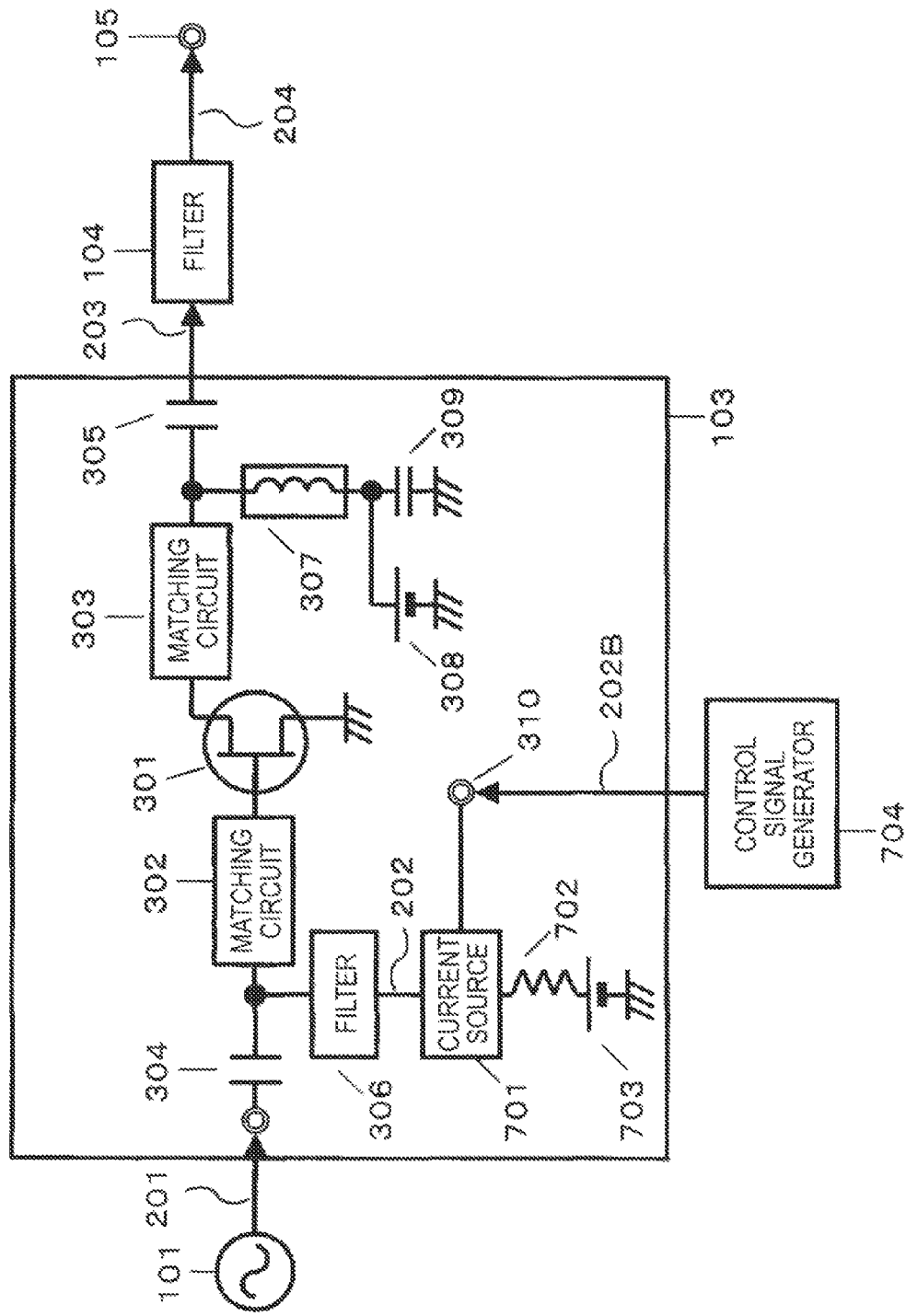
FIG. 7 is a drawing to show one example of the circuit configuration of the intermittent multiplier in the first embodiment of the invention.

FIG. 7 shows another example of the intermittent multiplier 103. The circuit configuration differs from that shown in FIG. 3 in that a current source 701, a resistor 702, a power supply 703, and a control signal generator 704 are provided and a control signal 202B is output from the control signal generator 704. Like the control signal 202, the control signal 202B has an on interval and an off interval. The current source 701 is controlled by the control signal 202B, whereby a current intermittently flows through the resistor 702 according to the on interval and the off interval of the control signal 202B and a voltage is applied.

Control signal 202 is generated by the voltage value applied to the resistor 702, changing according to the on interval and the off interval of the control signal 202B and the power supply 703, Vgs of the active element 301 is controlled by the control signal 202 as described in FIG. 3, Vgs at the on interval is the area 401 in FIG. 4, and Vgs at the off interval is the area 402, whereby a short pulse generator for generating a pulse signal at a high on/off ratio as described above can be realized. Any other point than the control method of Vgs is similar to the circuit configuration in FIG. 3 and therefore the operation will not be discussed again.

Figure 8:
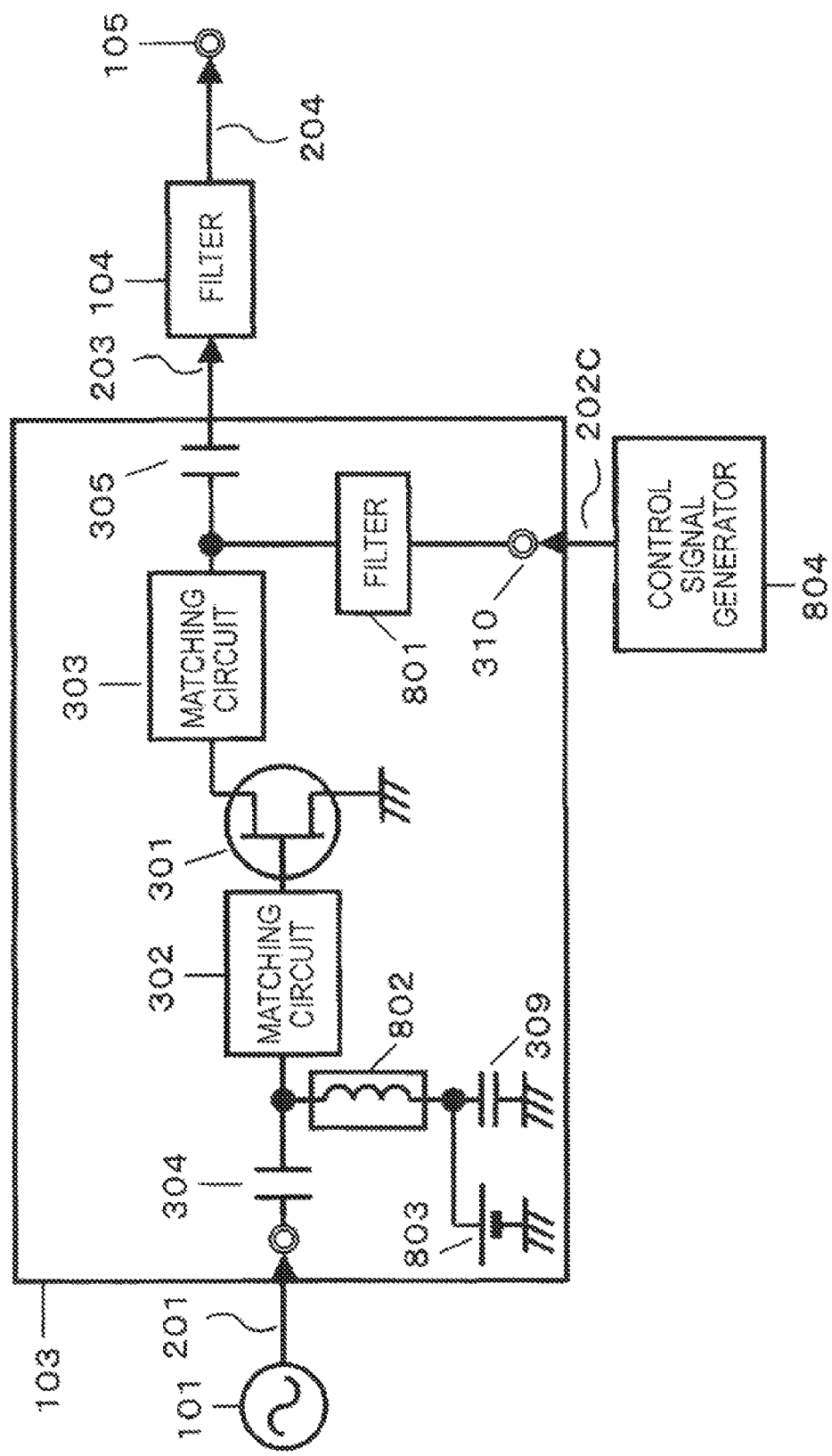
FIG. 8 is a drawing to show one example of the circuit configuration of the intermittent multiplier in the first embodiment of the invention.

A method of controlling Vds directly by a control signal may be adopted. FIG. 8 shows another example of the intermittent multiplier 103. The circuit configuration differs from that shown in FIG. 3 in that the filter 306, the DC feed device 307, and the power supply 308 are not provided and a filter 801, a DC feed device 802, a power supply 803, and a control signal generator 804 are provided and a control signal 202C is output from the control signal generator 804. Like the control signal 202, the control signal 202C has an on interval and an off interval and the pulse widths equal.

The filter 801 is a filter which becomes open at frequency f0 or is in the proximity thereof on a Smith chart when the impedance of the filter 801 side is observed from the transmission line connecting the matching circuit 303 and the coupler 305 in FIG. 8. In a distribution constant line, it is made up of electrical length λg/4 open stub and electrical length λg/4 line at the frequency f0. In a lumped-parameter element, it is made up of a capacitative element and a dielectric element.

When the filter 801 side is observed from the control signal input end 310, the frequency characteristic of input impedance becomes LPF in a low frequency band from DC because of the effect of the frequency characteristic of the filter 801. It is desirable that the cutoff frequency of the LPF at the time should be the reciprocal or more of the pulse width of the control signal 202C. The reason is as described above.

It is desirable that the filter 801 should be open at frequency f0/2 or be in the proximity thereof on a Smith chart when the impedance of the filter 801 side is observed from the transmission line connecting the matching circuit 303 and the coupler 305. The reason is as described above.

When the impedance of the DC feed device 802 side is observed from the transmission line connecting the matching circuit 302 and the coupler 304, the DC feed device 802 is open at least frequency f0/2 and ideally allows only a DC component to pass through. For example, at the frequency f0/2, in a distribution constant line, it is made up of electrical length λg/4 open stub and electrical length λg/4 line. In a lumped-parameter element, it is made up of a capacitative element and a dielectric element.

It is desirable that the DC feed device 802 should be open at frequency f0 when the impedance of the DC feed device 802 side is observed from the transmission line connecting the matching circuit 302 and the coupler 304. The reason is as described above. The bypass capacitor 309 is installed on the power supply 803 side for preventing parasitic oscillation. On the other hand, a bypass capacitor is not provided at the control signal input end 310. The reason is as described above.

Here, Vgs is set in the area 401 in FIG. 4 at all times and Vds at the on interval of the control signal 202C is set to Vds1, whereby the conversion gain of the intermittent multiplier 103 at the on interval can be made the maximum.

On the other hand, Vds at the off interval of the control signal 202 is set to Vds2. Vds2 is a smaller value than Vds1 and at this time, Id is zero. The operation point is thus set, whereby the conversion gain at the on interval of the control signal 202C can be made high and the conversion gain at the off interval can be made low and a short pulse generator for generating a pulse signal at a high on/off ratio can be realized with lower power consumption.

Figure 9:
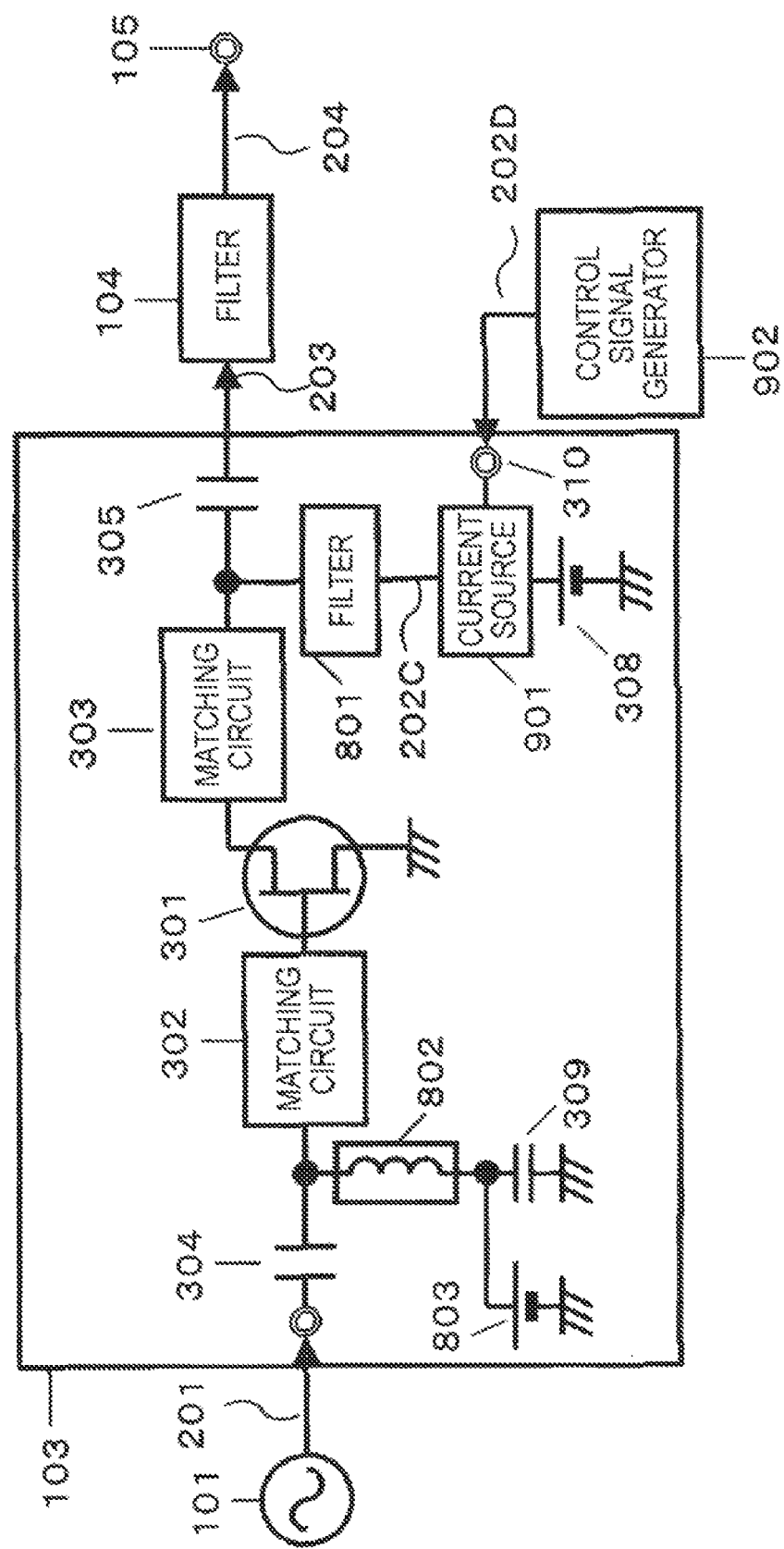
FIG. 9 is a drawing to show one example of the circuit configuration of the intermittent multiplier in the first embodiment of the invention.

A method of controlling Id by a control signal may be adopted. FIG. 9 shows another example of the intermittent multiplier 103. The circuit configuration differs from that in FIG. 8 in that a power supply 308, a current source 901, and a control signal generator 902 are provided and a control signal 202D is output from the control signal generator 902.

The current source 901 is controlled by the control signal 202D, whereby Vds at the on interval of the control signal 202C is set to Vds1 and Vds at the off interval is set to Vds2 and the intermittent multiplier is operated intermittently. Any other point than the control method of Vds is similar to the circuit configuration in FIG. 8 and therefore the operation will not be discussed again.

In the description, the oscillation frequency of the oscillator 101 is ½ of the frequency of the output signal and the intermittent multiplier 103 is a 2 multiplier (double). However, when n is a positive integer, the oscillation frequency of the oscillator 101 may be 1/n of the frequency of the output signal and the intermittent multiplier 103 may be an n multiplier.

In the description of the examples of the intermittent multiplier 103 with FIGS. 3 and 7 to 9, the filter 306 and the filter 801 and the DC feed device 307 and the DC feed device 802 are inserted between the coupler and the matching circuit in the circuit configuration, but may be inserted between the matching circuit and the active element 301 in the circuit configuration.

(Second Embodiment)

Figure 10:
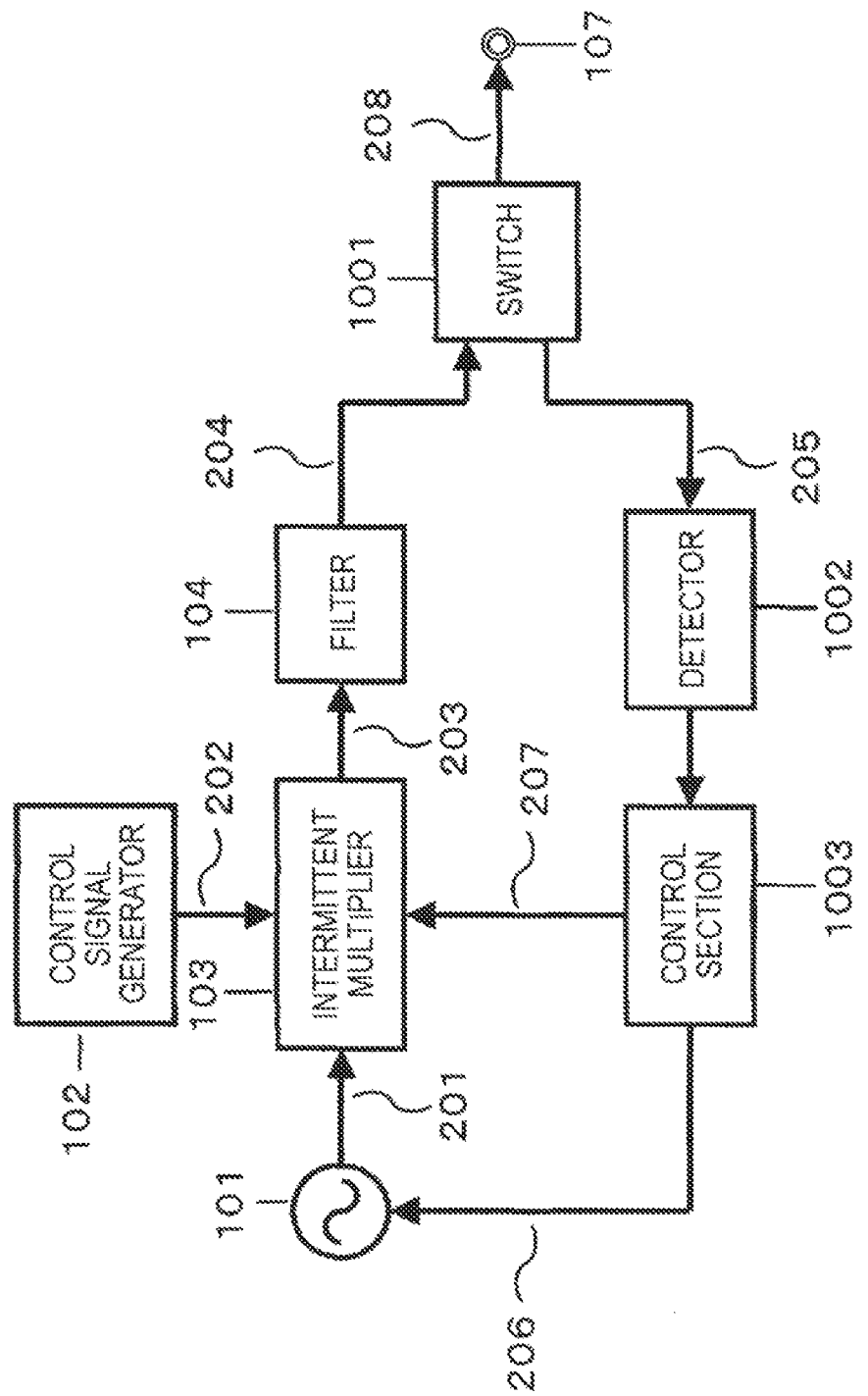
FIG. 10 is a drawing to show the circuit configuration of a communication apparatus in a second embodiment of the invention.

FIG. 10 is a block diagram to show the configuration of a pulse generator that can generate a pulse signal at a high on/off ratio and can adjust the power level in a second embodiment of the invention. The second embodiment differs from the first embodiment in that a switch 1001 is provided in place of the branch circuit 105 and the control section 106 includes a detector 1002 and a control section 1003.

The configuration shown in FIG. 10 is a transmitter-receiver. A transmitter includes an oscillator 101, a control signal generator 102, an intermittent multiplier 103, and a filter 104. A receiver includes the detector 1002 and the control section 1003. The transmitter and the receiver are connected by the switch 1001. The control section 1003 controls the oscillator 101 and the intermittent multiplier 103 based on the waveform detected by the detector 1002 included in the receiver. The control method is as described in the first embodiment.

A signal 201 from the oscillator 101 and a signal 202 from the control signal generator 102 are input to the intermittent multiplier 103 to generate a signal 203 and a signal 204 is generated through the filter 104. The process is described in the first embodiment and therefore will not be discussed in detail again.

The signal 204 is input to the switch 1001. The switch 1001 is, for example, an SPnT switch (n: Natural number) and has a function of switching transmission and reception. At the transmission timing, the switch 1001 turns on the transmission side so that the signal 204 sent through the filter 104 from the intermittent multiplier 103 is radiated from an output terminal 107. At the time, a signal 205 decreased as much as isolation of the switch 1001 relative to the signal 204 is rounded to the receiver. The signal 205 rounded to the receiver is input to the detector 1002 and the signal level is detected and the detection value is output to the control section 1003.

The mechanism for generating a signal 206 and a signal 207 in the control section 1003 and then controlling the power level of a signal 208 constant is described in the first embodiment and therefore will not be discussed in detail again.

As shown above, the conversion gain of the intermittent multiplier 103 at the on interval of the control signal and the conversion gain at the off interval are changed and the frequencies of the main component at the on interval and the off interval are changed, whereby the intermittent multiplier for generating a pulse signal at a high on/off ratio can be configured. The pulse generator that can generate a pulse signal at a high on/off ratio and can adjust the power level can be configured by using the intermittent multiplier, the control signal generator for generating a signal for controlling the conversion gain of the intermittent multiplier, the detector, and the control section.

In the description given above, the control signal 206 and the control signal 207 are generated in the control section 1003, but a demodulator is provided with the function and the control section 1003 may be replaced with the demodulator.

(Third Embodiment)

Figure 11:
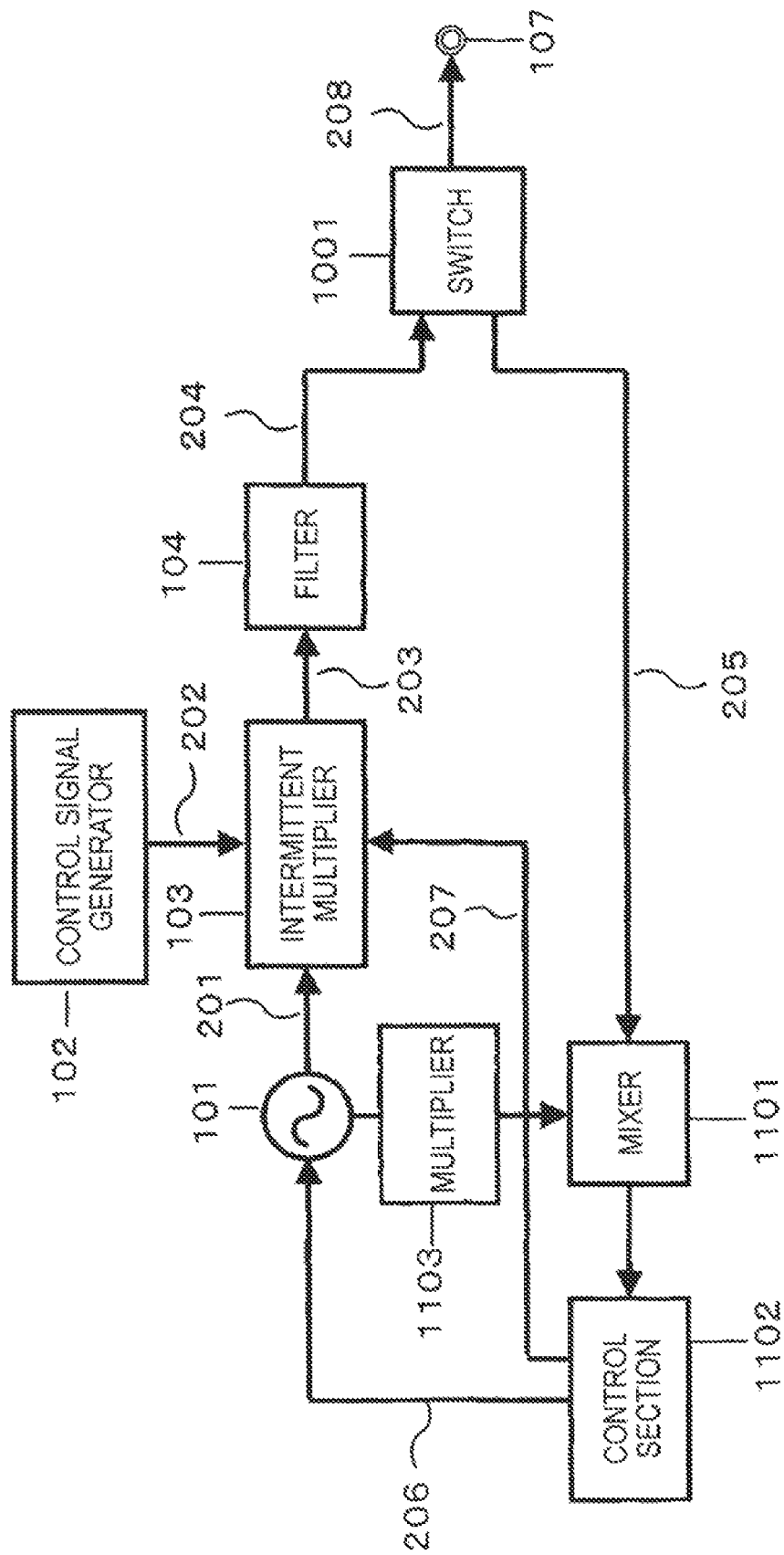
FIG. 11 is a drawing to show the circuit configuration of a communication apparatus in a third embodiment of the invention.
Figure 12:
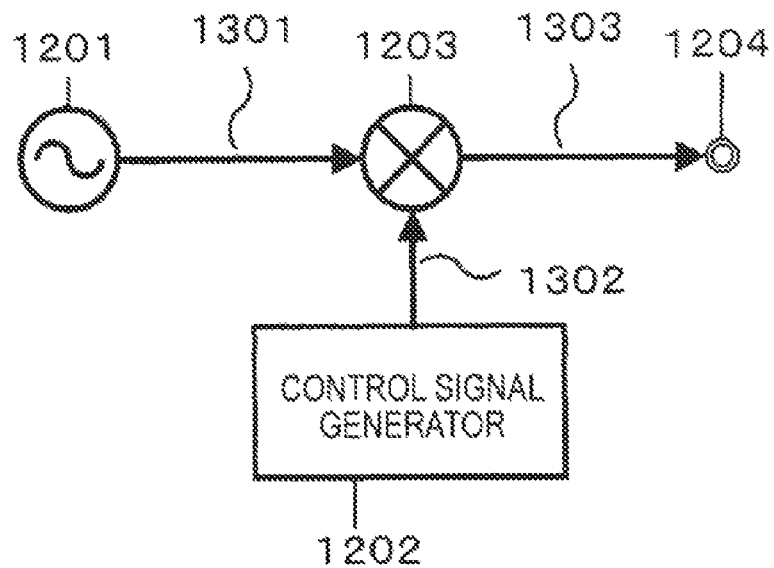
FIG. 12 is a drawing to show the circuit configuration of a short pulse generator in a related art.
Figure 13:
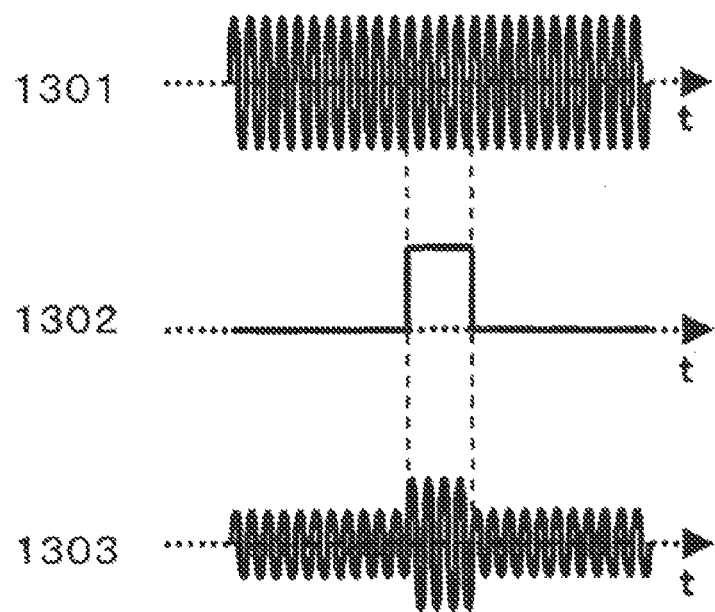
FIG. 13 is a drawing to show control signal waveforms in the related art.
Figure 14:
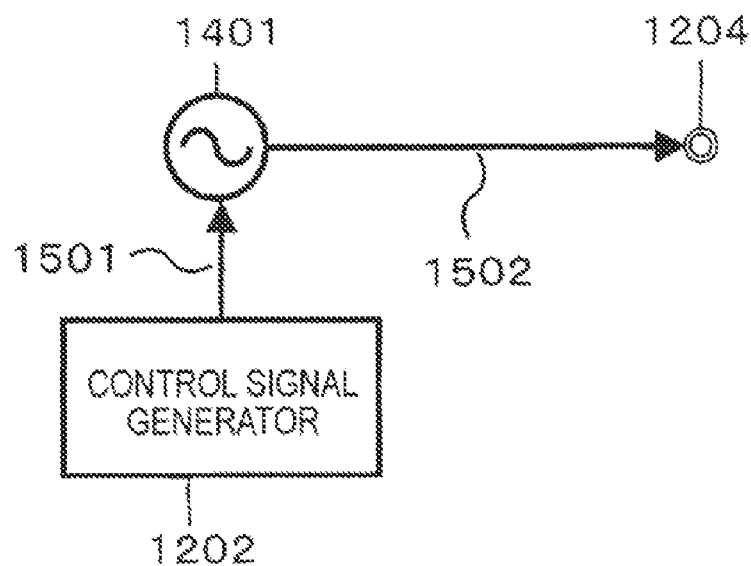
FIG. 14 is a drawing to show the circuit configuration of a short pulse generator in a related art.
Figure 15:
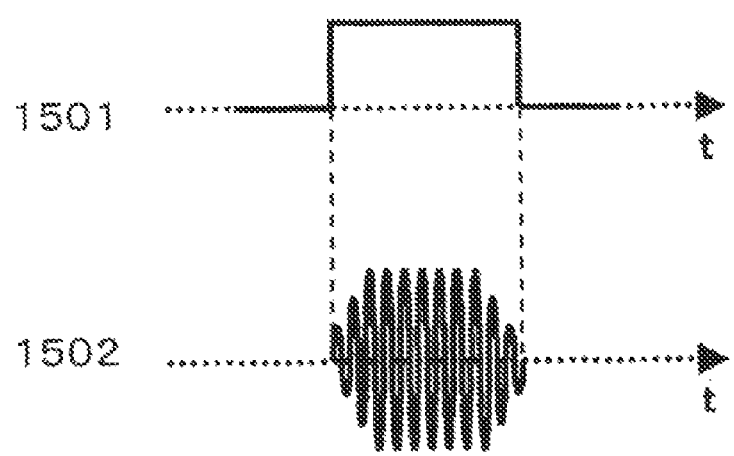
FIG. 15 is a drawing to show control signal waveforms in the related art.
Figure 16:
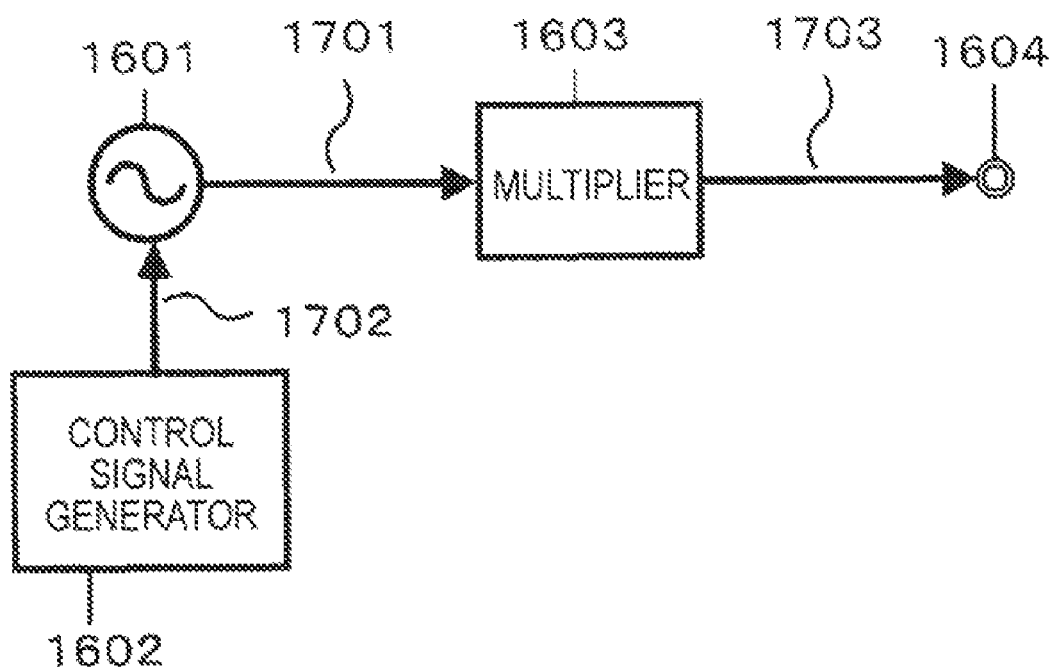
FIG. 16 is a drawing to show the circuit configuration of a modulation circuit in a related art.
Figure 17:
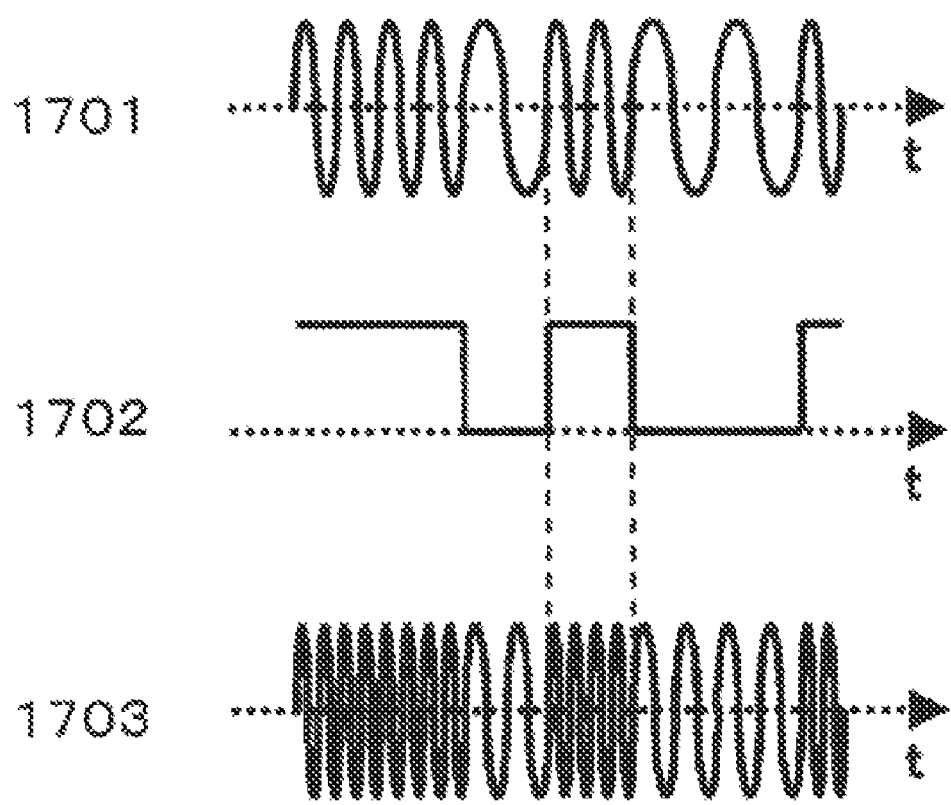
FIG. 17 is a drawing to show control signal waveforms in the related art.

FIG. 11 is a block diagram to show the configuration of a pulse generator that can generate a pulse signal at a high on/off ratio and can adjust the power level in a third embodiment of the invention. The third embodiment differs from the first embodiment in that a switch 1001 is provided in place of the branch circuit 105, the control section 106 includes a mixer 1101 and a control section 1102, and an intermittent multiplier 103 is provided between an oscillator 101 and the mixer 1101 for operating the mixer. As the intermittent multiplier 103, a known circuit is used.

The configuration shown in FIG. 11 is a transmitter-receiver as with the second embodiment. A transmitter includes an oscillator 101, a control signal generator 102, an intermittent multiplier 103, and a filter 104. A receiver includes the mixer 1101 and the control section 1102. The transmitter and the receiver are connected by the switch 1001. The control section 1102 controls the oscillator 101 and the intermittent multiplier 103 based on the output waveform of the mixer 1101 included in the receiver. The control method is as described in the first embodiment.

A signal 201 from the oscillator 101 and a signal 202 from the control signal generator 102 are input to the intermittent multiplier 103 to generate a signal 203 and a signal 204 is generated through the filter 104. The process is described in the first embodiment and therefore will not be discussed in detail again.

The signal 204 is input to the switch 1001. The switch 1001 is, for example, an SPnT switch (n: Natural number) and has a function of switching transmission and reception. At the transmission timing, the switch 1001 turns on the transmission side so that the signal 204 sent through the filter 104 from the intermittent multiplier 103 is radiated from an output terminal 107. At the time, a signal 205 decreased as much as isolation of the switch 1001 relative to the signal 204 is rounded to the receiver. The signal 205 rounded to the receiver is input to the mixer 1101 and the signal level is detected and the detection value is output to the control section 1102. At this time, the output signal of a multiplier 1103 is also input to the mixer 1101; the signal is provided for multiplying frequency.

The mechanism for generating a signal 206 and a signal 207 in the control section 1102 and then controlling the power level of a signal 208 constant is described in the first embodiment and therefore will not be discussed in detail again.

As shown above, the conversion gain of the intermittent multiplier 103 at the on interval of the control signal and the conversion gain at the off interval are changed and the frequencies of the main component at the on interval and the off interval are changed, whereby the intermittent multiplier for generating a pulse signal at a high on/off ratio can be configured. The pulse generator that can generate a pulse signal at a high on/off ratio and can adjust the power level can be configured by using the intermittent multiplier, the control signal generator for generating a signal for controlling the conversion gain of the intermittent multiplier, the mixer, and the control section.

In the description given above, the multiplier 1103 is provided at the preceding stage of the mixer 1101, but the mixer 1101 may be a harmonic mixer without providing the multiplier 1102.

In the description given above, the multiplier 1103 is provided at the preceding stage of the mixer 1101 and the oscillator 101 is shared between the transmission and the reception, but may be provided separately.

In the description given above, the control signal 206 and the control signal 207 are generated in the control section 1102, but a demodulator is provided with the function and the control section 1102 may be replaced with a controller.

(Fourth Embodiment)

Figure 18:
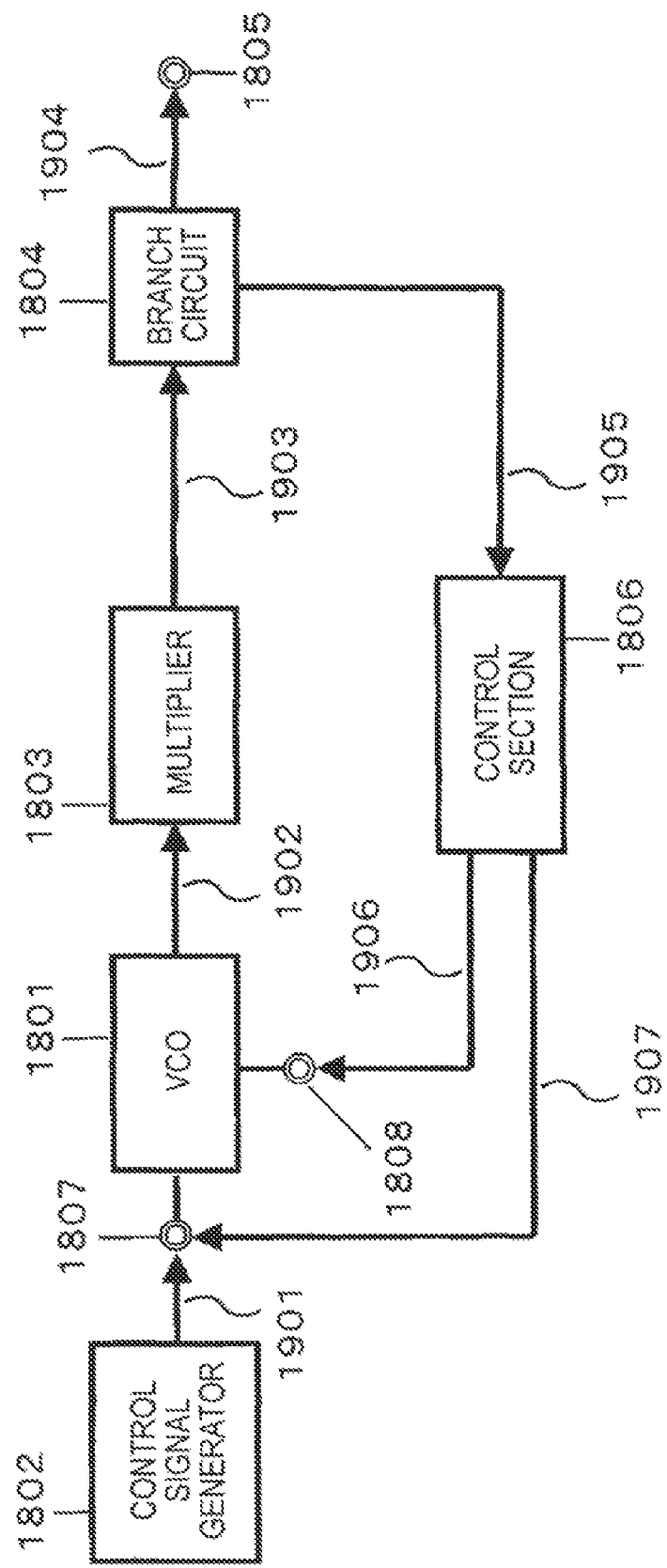
FIG. 18 is a drawing to show the circuit configuration of a communication apparatus in a fourth embodiment of the invention.

FIG. 18 is a block diagram of a communication apparatus in a fourth embodiment of the invention. A transmitter shown in FIG. 18 includes a voltage controlled oscillator 1801 (hereinafter, VCO), a control signal generator 1802, a multiplier 1803, a branch circuit 1804, an output terminal 1805, and a control section 1806. In VCO modulation, if locking is performed in PLL, modulation distortion is generated because of feedback control. Thus, in the description to follow, the VCO does not include PLL to prevent modulation distortion from occurring.

An active element is described as FET (field effect transistor). The multiplication number of the multiplier is n (n: A positive integer). In the description to follow, desired frequency of an output signal is f0, the frequency of the output signal of the oscillator is f0/2, and the intermittent multiplier is a 2 multiplier (double), but the embodiment is not limited to the mode.

Like the control signal generator 102, the control signal generator 1802 generates and outputs a control signal having an on interval and an off interval different in voltage value. The control signal output from the control signal generator 1802 is input to a Vt terminal 1807 of one terminal of the VCO 1801, whereby a frequency-modulated signal is output from the VCO 1801. The VCO 1801 performs frequency modulation based on the principle that origination frequency changes according to the voltage applied to the Vt terminal 1807. The frequency of the modulation signal output from the VCO 1801 is multiplied in the multiplier 1803. The multiplied signal is input to the branch circuit through which one is output from the output end 1805 and one is input to the control section 1806. The control section 1806 detects the level of the received signal. Based on the detected level, the control section 1806 generates a control signal input to a different terminal 1808 from the Vt terminal of the VCO 1801 and a control signal input to the Vt terminal 1807 of the VCO 1801. The control signal input to the different terminal 1808 of the VCO 1801 controls the oscillation output level, and the control signal input to the Vt terminal 1807 of the VCO controls the oscillation frequency of the VCO 1801. The control signals control the output level and the oscillation frequency of the signal output from the output end 1805. As the operation described above is performed, a frequency modulation circuit that can adjust (control) power level is configured. The frequency modulation circuit is an example of a signal modulator for performing signal modulation.

Figure 19:
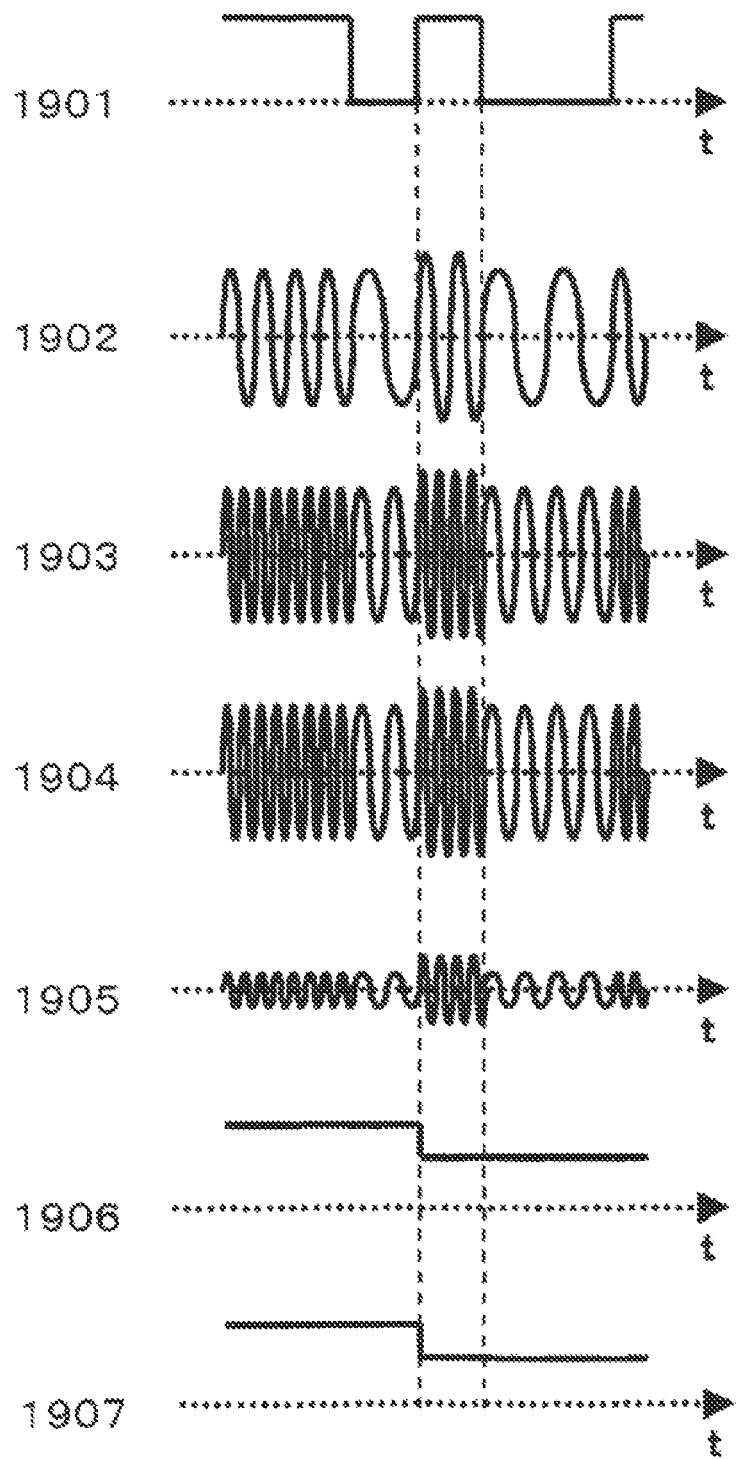
FIG. 19 is a drawing to show the features of signal waveforms in the fourth embodiment of the invention.

FIG. 19 is a timing chart of the signals and the control signals in the block diagram of FIG. 18. The vertical axis is the voltage and the horizontal axis is the time. The frequency modulation circuit that can adjust the power level in the embodiment will be discussed with FIGS. 18 and 19.

A signal 1901 output from the control signal generator 1802 is input to the Vt terminal 1807 of the VCO 1801, whereby the VCO 1801 oscillates. Since the oscillation frequency of the VCO 1801 changes according to the voltage applied to the Vt terminal 1807, the signal 1901 is input to the Vt terminal 1807, whereby the VCO 1801 outputs a frequency-modulated signal 1902 based on the signal 1901. The circuit configuration of the VCO 1801 is a known art and therefore will not be discussed.

The signal 1902 output from the VCO 1801 is input to the multiplier 1803, which then multiplies the frequency of the signal 1902 to generate a signal 1903.

The signal 1903 is input to the branch circuit 1804, which then branches the signal to a signal 1904 and a signal 1905.

The signal 1905 is a signal for adjusting the power level and thus the power level of the signal is small as compared with the signal 1904. The branch circuit is a known art and therefore will not be discussed in detail. The signal 1904 output from the branch circuit 1804 is output to the output terminal 1805. On the other hand, the signal 1905 is input to the control section 1806, which then detects the level of the signal 1905. The control section 1806 detects the power value of the signal in a carrier frequency band of the output signal 1904 and is not involved in the power value of the signal in any other band.

The control section 1806 makes a comparison between the detection value and a desired value. The desired value is calculated from any desired output level in the output terminal 1805 and the distribution ratio in the branch circuit 1805. For example, if the desired output level is P1 and the distribution ratio is 9:1, the desired value in the control section 1806 becomes P1/10. The control section 1806 generates a signal 1906 for controlling the oscillation function of the VCO 1801 and a signal 1907 for controlling the modulation function of the VCO 1801. If a difference exists between the detection value and the desired value in the control section 1806, the operation of the oscillation function and the modulation function of the VCO 1801 is controlled by the control signal 1906 and the control signal 1907.

Specifically, the control signal 1906 controls the bias voltage of the VCO 1801, thereby controlling the signal level of the signal 1901. The part of the VCO 1801 controlled by the control signal 1906 is bias of FET of the component and is a drain voltage and a gate voltage. A switch may be provided at the later stage of the VCO 1801 and may be controlled by the control signal 1906 and may be switched for adjusting the signal level of the signal 1902. These techniques are known arts and therefore will not be discussed.

The control signal 1907 controls the bias voltage of the Vt terminal of the VCO 1801, thereby controlling the modulation function of the VCO 1801.

For example, the case where the control section 1806 determines that the power level in the output terminal 1805 is smaller 1 dB than the desired value is considered. In this case, the control signal 1906 controls so as to decrease 1 dB the power level of the signal 1902 output from the VCO 1801; if the bias voltage of the VCO 1801 is lowered, the voltage applied to the Vt terminal 1807 and the characteristic of the oscillation frequency change. Thus, if the power level of the signal 1902 is decreased 1 dB, the oscillation frequency changes. It may occur because PLL is not installed to circumvent modulation distortion in the VCO 1801 used with the frequency modulation circuit.

Then, the control signal 1907 controls the bias voltage of the Vt terminal 1807 to correct shift of the voltage applied to the Vt terminal 1807 and the characteristic of the oscillation frequency. In so doing, the output power level can be decreased without changing the carrier frequency of the frequency modulation signal and the transmission power level can be controlled easily.

As shown above, the bias voltage applied to the Vt terminal of the VCO in the frequency modulation circuit configured as the VCO is directly modulated, whereby the frequency modulation circuit including the power control function can be configured easily.

While the invention has been described in detail with reference to the specific embodiments, it will be obvious to those skilled in the art that various changes and modifications can be made without departing from the spirit and the scope of the invention.

This application is based on Japanese Patent Application No. 2007-340250 filed on Dec. 28, 2007 and Japanese Patent Application No. 2008-325654 filed on Dec. 22, 2008, which are incorporated herein by reference.

Industrial Applicability

The pulse generator of the invention that can generate a pulse signal at a high on/off ratio and can adjust the power level intermittently controls the conversion gain by controlling the operation point of the intermittent multiplier in accordance with the voltage value of the control signal. If a filter is provided at the later stage, a spurious component can be suppressed and a pulse signal having the advantage that a pulse signal at a high on/off ratio can be obtained as low power consumption operation is included, whereby the pulse generator can be used as a pulse generator, etc., in high-speed wireless communications.

The invention claimed is:

1. A signal modulator for generating a pulse signal based on a continuous signal output from an oscillator, the signal modulator comprising:
a control signal generator that outputs a first control signal containing an on interval at which a voltage value of the first control signal is high and an off interval at which the voltage value of the first control signal is low;
an intermittent multiplier that receives inputs of the first control signal and the continuous signal and multiplies the continuous signal corresponding to the on interval of the first control signal to output the pulse signal; and
a control section that detects a level of the pulse signal to generate a second control signal for controlling a level of the continuous signal output from the oscillator and a third control signal for controlling a conversion gain of the intermittent multiplier,
wherein the conversion gain of the intermittent multiplier at the on interval of the first control signal is higher than the conversion gain of the intermittent multiplier at the off interval of the first control signal.

2. The signal modulator according to claim 1, wherein the intermittent multiplier has an active element and a control signal input end connected to a control terminal of the active element, the control signal input end to which the first control signal is input; and
wherein a cutoff frequency of impedance obtained by measuring the active element side from the control signal input end is equal to or greater than the reciprocal of a time width of the on interval of the first control signal.

3. The signal modulator according to claim 1, comprising:
a branch circuit that branches an output signal of the intermittent multiplier to radiate one output signal to space and to output the other output signal to the control section.

4. The signal modulator according to claim 1, comprising:
a switch that branches an output signal of the intermittent multiplier to radiate one output signal to space and to output the other output signal to the control section.

5. The signal modulator according to claim 1, comprising:
a filter that allows a frequency band component of the output signal of the intermittent multiplier to pass through and suppresses other frequency band components of the output signal of the intermittent multiplier.

6. The signal modulator according to claim 1, wherein the intermittent multiplier has an active element; and
wherein an amplitude of the first control signal output from the control signal generator is greater than an amplitude of the continuous signal measured in a control terminal of the active element at the off interval of the first control signal.

7. The signal modulator according to claim 1, comprising:
an amplification section that amplifies the first control signal and is provided between the control signal input end and a control terminal of an active element,
wherein the first control signal, amplified by the amplification section and having an amplitude being larger than an amplitude of the continuous signal, is input to the active element at the off interval of the first control signal.

8. A signal modulator comprising:
a control signal generator that generates a first control signal containing an on interval at which a voltage value of the first control signal is high and an off interval at which the voltage value of the first control signal is low;
a voltage controlled oscillator that outputs a modulation signal subjected to a frequency modulation based on the first control signal; and
a control section that detects a level of the modulation signal to generate a second control signal for controlling a level of the modulation signal output from the voltage controlled oscillator and a third control signal for controlling a voltage level of a voltage control terminal of the voltage controlled oscillator to correct shift of a characteristic of an oscillation frequency applied to the voltage control terminal of the voltage controlled oscillator.

* * * * *